US011594623B2

United States Patent
Xu et al.

(10) Patent No.: US 11,594,623 B2
(45) Date of Patent: Feb. 28, 2023

(54) NANOWIRE TRANSISTOR AND MANUFACTURING METHOD THEREOF

(71) Applicant: TSINGHUA UNIVERSITY, Beijing (CN)

(72) Inventors: Feng Xu, Beijing (CN); Bin Gao, Beijing (CN); Xinyi Li, Beijing (CN); Huaqiang Wu, Beijing (CN); He Qian, Beijing (CN)

(73) Assignee: TSINGHUA UNIVERSITY, Beijing (CN)

( * ) Notice: Subject to any disclaimer, the term of this patent is extended or adjusted under 35 U.S.C. 154(b) by 0 days.

(21) Appl. No.: 17/058,211

(22) PCT Filed: Aug. 3, 2018

(86) PCT No.: PCT/CN2018/098554
§ 371 (c)(1),
(2) Date: Nov. 24, 2020

(87) PCT Pub. No.: WO2019/223115
PCT Pub. Date: Nov. 28, 2019

(65) Prior Publication Data
US 2021/0184025 A1    Jun. 17, 2021

(30) Foreign Application Priority Data
May 24, 2018  (CN) .......................... 201810509202.7

(51) Int. Cl.
*H01L 29/775* (2006.01)
*H01L 29/06* (2006.01)
(Continued)

(52) U.S. Cl.
CPC .......... *H01L 29/775* (2013.01); *H01L 29/068* (2013.01); *H01L 29/0669* (2013.01);
(Continued)

(58) Field of Classification Search
CPC ..... H01L 29/0669–068; H01L 29/1054; H01L 29/165; H01L 29/41733; H01L 29/41766;
(Continued)

(56) References Cited

U.S. PATENT DOCUMENTS 7,180,107 B2   2/2007  Appenzeller et al.
9,287,360 B1 *  3/2016  Basu ................... H01L 29/0847
(Continued)

FOREIGN PATENT DOCUMENTS

CN    1476105 A    2/2004
CN   101065811 A   5/2005
(Continued)

OTHER PUBLICATIONS

Pei-Jung Chao and Y. Li, "Impact of Geometry Aspect Ratio on 10-nm Gate-All-Around Silicon-Germanium Nanowire Field Effect Transistors"; 14th IEEE International Conference on Nanotechnology, Toronto, ON, 2014, pp. 452-455.
(Continued)

*Primary Examiner* — Yu Chen
(74) *Attorney, Agent, or Firm* — Loeb & Loeb LLP

(57) ABSTRACT

A nanowire transistor and a manufacture method thereof are provided. The nanowire transistor includes a semiconductor wire, a semiconductor layer, a source electrode and a drain electrode. The semiconductor wire includes a first semiconductor material and includes a source region, a drain region, and a channel region, along an axial direction of the semiconductor wire, the channel region is between the source region and the drain region; the semiconductor layer includes a second semiconductor material and covers the channel region of the semiconductor wire; the source electrode is in the source region of the semiconductor wire and is in direct contact with the source region of the semiconductor wire, and the drain electrode is in the drain region of
(Continued)

the semiconductor wire and is in direct contact with the drain region of the semiconductor wire.

15 Claims, 22 Drawing Sheets

(51) Int. Cl.
*H01L 29/165* (2006.01)
*H01L 29/66* (2006.01)
*H01L 29/78* (2006.01)
*H01L 29/10* (2006.01)
*H01L 29/423* (2006.01)
*H01L 29/786* (2006.01)
*B82Y 10/00* (2011.01)
*H01L 29/417* (2006.01)

(52) U.S. Cl.
CPC ........ *H01L 29/1054* (2013.01); *H01L 29/165* (2013.01); *H01L 29/42392* (2013.01); *H01L 29/66439* (2013.01); *H01L 29/7849* (2013.01); *H01L 29/78696* (2013.01); *B82Y 10/00* (2013.01); *H01L 29/41766* (2013.01)

(58) Field of Classification Search
CPC ......... H01L 29/41775; H01L 29/42392; H01L 29/7849; H01L 29/78696; H01L 29/66439; H01L 29/66469; H01L 29/775; H01L 29/78687; H01L 29/785; H01L 29/7853; H01L 2029/7858; B82Y 10/00
See application file for complete search history.

(56) References Cited

U.S. PATENT DOCUMENTS

| | | | |
|---|---|---|---|
| 2007/0157873 A1 | 7/2007 | Hauptmann | |
| 2009/0294757 A1* | 12/2009 | Wernersson | H01L 29/165 257/14 |
| 2010/0072455 A1 | 3/2010 | Crowder | |
| 2013/0302955 A1* | 11/2013 | Vinet | H01L 29/42392 977/938 |
| 2014/0209998 A1* | 7/2014 | Masuoka | H01L 29/42372 257/329 |
| 2016/0093745 A1* | 3/2016 | Diaz | H01L 29/78642 257/29 |
| 2017/0110373 A1* | 4/2017 | Xiao | H01L 29/4908 |
| 2017/0133495 A1 | 5/2017 | Cho et al. | |
| 2018/0012962 A1* | 1/2018 | Yeh | H01L 29/778 |
| 2018/0061996 A1 | 3/2018 | Oh | |

FOREIGN PATENT DOCUMENTS

| | | | |
|---|---|---|---|
| CN | 104201205 A | 12/2014 | |
| CN | 104241138 A * | 12/2014 | ......... H01L 29/0673 |

OTHER PUBLICATIONS

China National Intellectual Property Administration, International Search Report, dated Dec. 12, 2018, 4 pages.

China National Intellectual Property, Written Opinion, dated Dec. 12, 2018, 5 pages.

* cited by examiner

NANOWIRE TRANSISTOR AND MANUFACTURING METHOD THEREOF

This application is an US National Phase application claiming priority to the PCT International Application PCT/CN2018/098554, filed on Aug. 3, 2018, which claims priority of the Chinese Patent Application No. 201810509202.7, filed on May 24, 2018. For all purposes, the entire disclosure of the aforementioned application is incorporated by reference as part of the disclosure of this application.

TECHNICAL FIELD

At least one embodiment of the present disclosure relates to a nanowire transistor and a manufacture method thereof.

BACKGROUND

As the size of the semiconductor device reduces, traditional bulk silicon or planar MOSFET devices have encountered severe short-channel effects and sub-threshold swing degradation. In order to reply this challenge, the ring-gate nanowire transistor has become one of the next generation of potential candidates. Because germanium materials have higher mobility and good compatibility with modern CMOS silicon technology, nanowire transistors with germanium core and silicon shell structure have attracted more and more attention. Based on the core-shell structure, strain effect and band engineering are introduced, which not only helps to improve the carrier transport characteristics, but also has potential applications in chemical sensors, tunnel field effect transistors, and quantum dots.

SUMMARY

At least one embodiment of the present disclosure provides a nanowire transistor, and the nanowire transistor comprises: a semiconductor wire, a semiconductor layer, a source electrode and a drain electrode. The semiconductor wire comprises a first semiconductor material and comprises a source region, a drain region, and a channel region, and along an axial direction of the semiconductor wire, the channel region is between the source region and the drain region; the semiconductor layer comprises a second semiconductor material and covers the channel region of the semiconductor wire; the source electrode is in the source region of the semiconductor wire and is in direct contact with the source region of the semiconductor wire, and the drain electrode is in the drain region of the semiconductor wire and is in direct contact with the drain region of the semiconductor wire.

For example, in the nanowire transistor provided by at least one embodiment of the present disclosure, in a direction perpendicular to the axial direction of the semiconductor wire, both the source electrode and the drain electrode do not overlap with the semiconductor layer.

For example, in the nanowire transistor provided by at least one embodiment of the present disclosure, the source electrode covers at least a part of the source region of the semiconductor wire; and the drain electrode covers at least a part of the drain region of the semiconductor wire.

For example, in the nanowire transistor provided by at least one embodiment of the present disclosure, the semiconductor layer covers the source region of the semiconductor wire and the drain region of the semiconductor wire; a portion of the semiconductor layer in the source region comprises a first via hole penetrating the semiconductor layer, and a portion of the semiconductor layer in the drain region comprises a second via hole penetrating the semiconductor layer; the source electrode directly contacts the source region of the semiconductor wire through the first via hole; and the drain electrode directly contacts the drain region of the semiconductor wire through the second via hole.

For example, in the nanowire transistor provided by at least one embodiment of the present disclosure, the semiconductor layer covers the source region of the semiconductor wire and the drain region of the semiconductor wire; a portion of the semiconductor layer in the source region comprises a first groove penetrating the semiconductor layer and surrounding the semiconductor wire, and a portion of the semiconductor layer in the drain region comprises a second groove penetrating the semiconductor layer and surrounding the semiconductor wire; the source electrode directly contacts the source region of the semiconductor wire through the first groove; and the drain electrode directly contacts the drain region of the semiconductor wire through the second groove.

For example, in the nanowire transistor provided by at least one embodiment of the present disclosure, a length of the channel region is equal to a length of the semiconductor layer along the axial direction of the semiconductor wire.

For example, the nanowire transistor provided by at least one embodiment of the present disclosure further comprises: a gate oxide layer and a gate electrode. The gate oxide layer covers the semiconductor layer; the gate electrode covers the gate oxide layer; along the axial direction of the semiconductor wire, two ends of the semiconductor layer protrude from the gate oxide layer and the gate electrode, or, along the axial direction of the semiconductor wire, the two ends of the semiconductor layer are respectively flush with two ends of the gate electrode.

For example, in the nanowire transistor provided by at least one embodiment of the present disclosure, in a direction perpendicular to the axial direction of the semiconductor wire, the source electrode does not overlap with the gate oxide layer, and the drain electrode does not overlap with the gate oxide layer; and in the direction perpendicular to the axial direction of the semiconductor wire, the source electrode does not overlap with the gate electrode, and the drain electrode does not overlap with the gate electrode.

For example, in the nanowire transistor provided by at least one embodiment of the present disclosure, a lattice constant of the first semiconductor material is greater than a lattice constant of the second semiconductor material.

For example, in the nanowire transistor provided by at least one embodiment of the present disclosure, the first semiconductor material comprises germanium or germanium silicon, and the second semiconductor material comprises silicon.

For example, in the nanowire transistor provided by at least one embodiment of the present disclosure, the semiconductor wire is in a cylindrical shape, and the semiconductor layer is in an annular shape.

At least one embodiment of the present disclosure further provides a manufacture method of a nanowire transistor, and the manufacture method comprises: providing a semiconductor wire, in which the semiconductor wire comprises a first semiconductor material and comprises a source region, a drain region, and a channel region, along an axial direction of the semiconductor wire, the channel region is between the source region and the drain region; forming a semiconductor layer, wherein the semiconductor layer comprises a second semiconductor material and covers the channel region of the semiconductor wire; and forming a source electrode and a drain electrode, wherein the source electrode is in the source region of the semiconductor wire and is in direct contact with the source region of the semiconductor wire, and the drain electrode is in the drain region of the semiconductor wire and is in direct contact with the drain region of the semiconductor wire.

For example, in the manufacture method of the nanowire transistor provided by at least one embodiment of the present disclosure, forming the semiconductor layer comprises: forming a semiconductor material layer covering the semiconductor wire; and removing portions of the semiconductor material layer covering the source region and the drain region by a patterning process to form the semiconductor layer.

For example, in the manufacture method of the nanowire transistor provided by at least one embodiment of the present disclosure, forming the source electrode and the drain electrode comprises: forming the source electrode in the source region after removing the portions of the semiconductor material layer; and forming the drain electrode in the drain region after removing the portions of the semiconductor material layer, in which in a direction perpendicular to the axial direction of the semiconductor wire, the source electrode and the drain electrode do not overlap with the semiconductor layer.

For example, in the manufacture method of the nanowire transistor provided by at least one embodiment of the present disclosure, the source electrode covers the source region of the semiconductor wire; and the drain electrode covers the drain region of the semiconductor wire.

For example, in the manufacture method of the nanowire transistor provided by at least one embodiment of the present disclosure, forming the semiconductor layer comprises: forming a semiconductor material layer covering the semiconductor wire; and forming a first via hole penetrating the semiconductor material layer in a portion of the semiconductor material layer in the source region and forming a second via hole penetrating the semiconductor material in a portion of the semiconductor material layer in the drain region by a patterning process.

For example, the manufacture method of the nanowire transistor provided by at least one embodiment of the present disclosure further comprises: after forming the first via hole and the second via hole, forming the source electrode in the source region of the semiconductor wire and forming the drain electrode in the drain region of the semiconductor wire, in which the source electrode directly contacts the source region of the semiconductor wire through the first via hole, and the drain electrode directly contacts the drain region of the semiconductor wire through the second via hole.

For example, in the manufacture method of the nanowire transistor provided by at least one embodiment of the present disclosure, forming the semiconductor layer comprises: forming a semiconductor material layer covering the semiconductor wire; forming a first groove penetrating the semiconductor material layer and surrounding the semiconductor wire in a portion of the semiconductor material layer in the source region, and forming a second groove penetrating the semiconductor material layer and surrounding the semiconductor wire in a portion of the semiconductor material layer in the drain region by a patterning process.

For example, the manufacture method of the nanowire transistor provided by at least one embodiment of the present disclosure further comprises: after forming the first groove and the second groove, forming the source electrode in the source region of the semiconductor wire and forming the drain electrode in the drain region of the semiconductor wire, in which the source electrode directly contacts the source region of the semiconductor wire through the first groove, and the drain electrode directly contacts the drain region of the semiconductor wire through the second groove.

For example, the manufacture method of the nanowire transistor provided by at least one embodiment of the present disclosure further comprises: forming a gate oxide layer covering the semiconductor layer; and forming a gate electrode covering the gate oxide layer, in which along the axial direction of the semiconductor wire, two ends of the semiconductor layer protrude from the gate oxide layer and the gate electrode, or, along the axial direction of the semiconductor wire, the two ends of the semiconductor layer are respectively flush with two ends of the gate oxide layer.

BRIEF DESCRIPTION OF THE DRAWINGS

In order to clearly illustrate the technical solution of the embodiments of the present disclosure, the drawings of the embodiments will be briefly described in the following. It is obvious that the described drawings in the following are only related to some embodiments of the present disclosure and thus are not limitative of the present disclosure.

REFERENCE NUMERALS

11—germanium core; 201—silicon shell; 301—source electrode; 401—drain electrode; 501—gate oxide layer; 601—gate electrode; 1—semiconductor wire; 101—channel region; 102—source region; 103—drain region; 2—semiconductor layer; 21—semiconductor material layer; 3—source electrode; 31—source/drain material layer; 4—drain electrode; 5—gate oxide layer; 6—gate electrode; 701—first via hole; 702—second via hole; 801—first groove; 802—second groove; 9—evaporation mask; 10—nanowire transistor.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", "coupled", etc., are not intended to define a physical connection or mechanical connection, but may include an electrical connection, directly or indirectly. "On," "under," "left," "right" and the like are only used to indicate relative position relationship, and when the position of the object which is described is changed, the relative position relationship may be changed accordingly.

The drawings in the present disclosure are not drawn strictly according to actual scale, and the specific size and quantity of each structure may be determined according to actual needs. The drawings described in the present disclosure are only schematic structural diagrams.

Figure 1A:
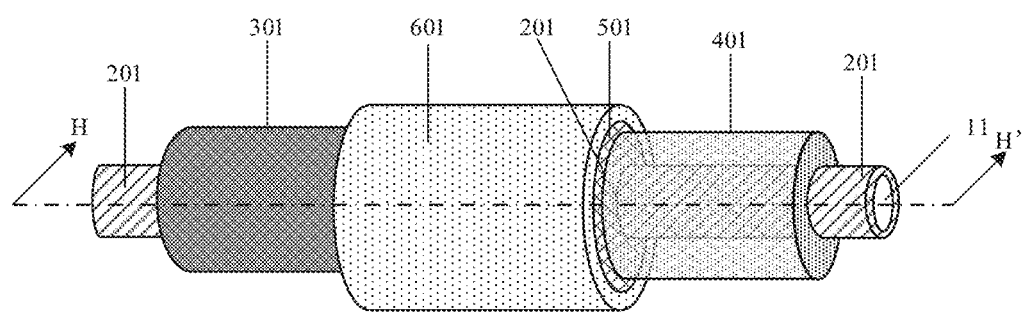
FIG. 1A is a schematic diagram of a three-dimensional structure of a nanowire transistor.
Figure 1B:
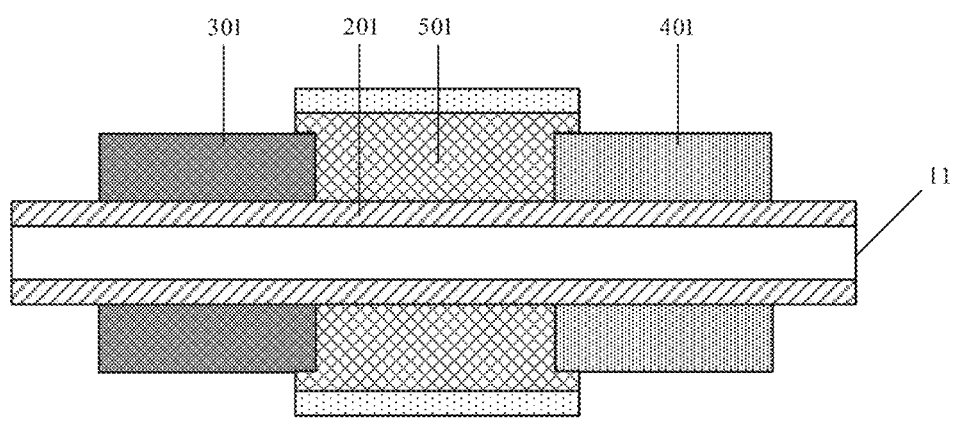
FIG. 1B is a cross-sectional diagram taken along a line H-H' in FIG. 1A.

FIG. 1A is a schematic diagram of a three-dimensional structure of a nanowire transistor, and FIG. 1B is a cross-sectional diagram taken along the line H-H' in FIG. 1A. As illustrated in FIG. 1A and FIG. 1B, the nanowire transistor includes a semiconductor wire 11, a silicon shell 201, a gate oxide layer 501, a gate electrode 601, a source electrode 301, and a drain electrode 401. The semiconductor layer 201 covers the entire side surface of the semiconductor wire 11 (the curved surface surrounding the axial direction of the semiconductor wire in the figure); in the direction perpendicular to the axial direction of the semiconductor wire, the source electrode 301 and the drain electrode 401 overlap with the silicon shell 201, and in the direction perpendicular to the axial direction of the semiconductor wire, both a part of the source electrode 301 and a part of the drain electrode 401 overlap with the gate electrode 501. The material of the gate oxide layer 501 of the nanowire transistor is an insulating material, such as silicon dioxide, so as to insulate the source electrode 301 from the gate electrode 601, and insulate the drain electrode 401 from the gate electrode 601. In this nanowire transistor, on the one hand, the silicon shell 201 is disposed between the entire source electrode 301 and the semiconductor wire 11, and between the entire drain electrode 401 and the semiconductor wire 11, and the gate electric field has a weak control effect on the channel, which causes current leakage of the drain electrode to a certain extent, thereby limiting the improvement of the on-off state current ratio of the nanowire transistor; on the other hand, because both the source electrode 301 of the nanowire transistor and drain electrode 401 of the nanowire transistor include portions that overlap with the gate electrode 601, a strong gate-induced current leakage of the drain electrode is generated, which also limits the improvement of on-off state current ratio of the nanowire transistor.

At least one embodiment of the present disclosure provides a nanowire transistor, the nanowire transistor includes a semiconductor wire, a semiconductor layer, a source electrode and a drain electrode. The semiconductor wire includes a first semiconductor material and includes a source region, a drain region, and a channel region, along an axial direction of the semiconductor wire, the channel region is between the source region and the drain region; the semiconductor layer includes a second semiconductor material and covers the channel region of the semiconductor wire; the source electrode is in the source region of the semiconductor wire and is in direct contact with the source region of the semiconductor wire, and the drain electrode is in the drain region of the semiconductor wire and is in direct contact with the drain region of the semiconductor wire.

Figure 2A:
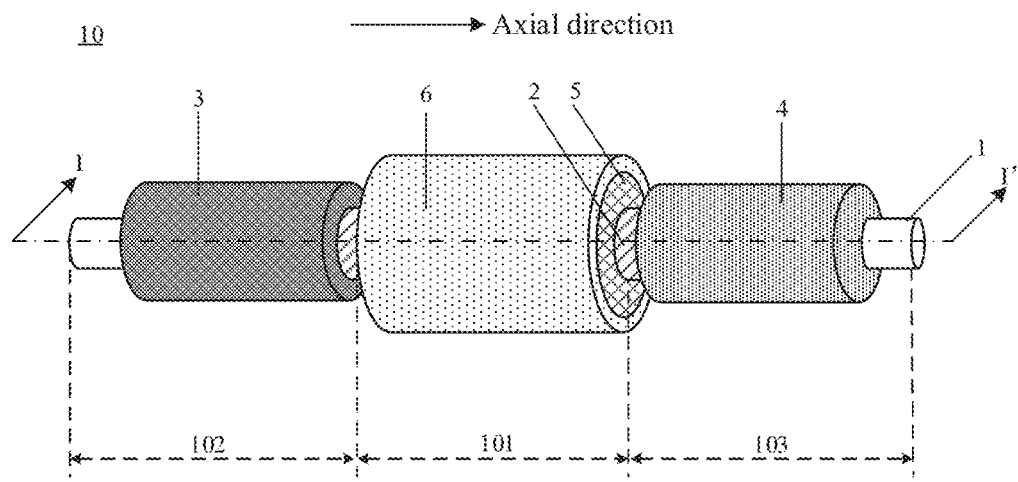
FIG. 2A is a schematic diagram of a three-dimensional structure of a nanowire transistor provided by an embodiment of the present disclosure.
Figure 2B:
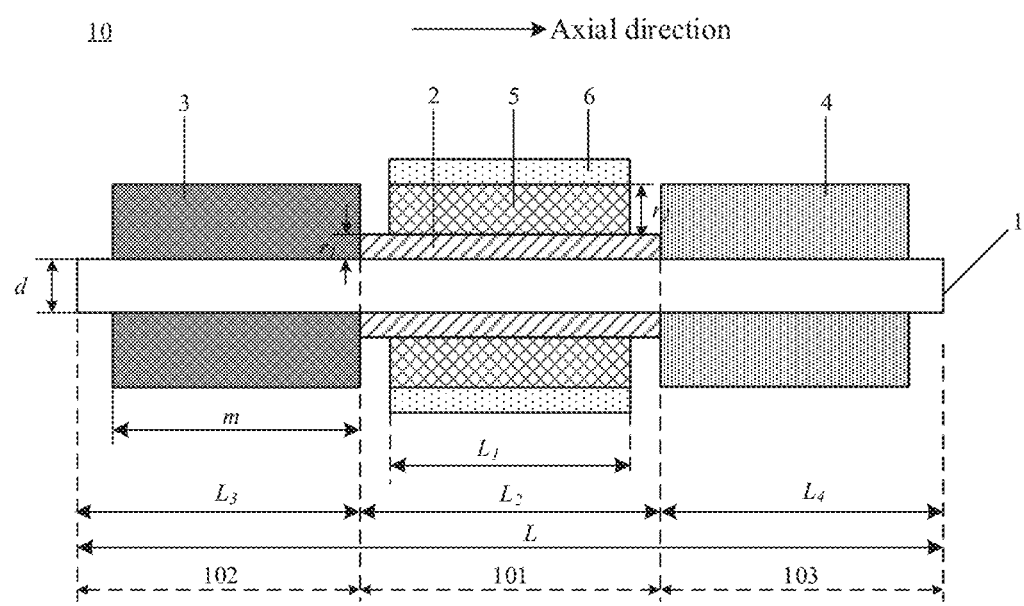
FIG. 2B is a cross-sectional diagram taken along a line I-I' in FIG. 2A.

Exemplarily, FIG. 2A is a schematic diagram of a three-dimensional structure of a nanowire transistor provided by an embodiment of the present disclosure, and FIG. 2B is a cross-sectional diagram along the line I-I' in FIG. 2A. As illustrated in FIG. 2A and FIG. 2B, the nanowire transistor 10 includes a semiconductor wire 1, a semiconductor layer 2, a source electrode 3, and a drain electrode 4. The semiconductor wire 1 includes a first semiconductor material and includes a channel region 101, a source region 102 and a drain region 103. Along the axial direction of the semiconductor wire illustrated in FIG. 2B, the channel region 101 is between the source region 102 and the drain region 103. The semiconductor layer 2 includes a second semiconductor material and covers the channel region 101 of the semiconductor wire 1. The source electrode 3 is in the source region 102 of the semiconductor wire 1 and is in direct contact with the source region 102 of the semiconductor wire 1, and the drain electrode 4 is in the drain region 103 of the semiconductor wire 1 and is in direct contact with the drain region 103 of the semiconductor wire 1. In the embodiments of the present disclosure, because both the source electrode and drain electrode are in direct contact with the semiconductor wire, the control effect of gate electric field on the channel is strengthened, thereby avoiding or reducing gate-induced current leakage of the drain electrode, which is beneficial to improve the on-off state current ratio of the nanowire transistor.

For example, the lattice constant of the first semiconductor material is greater than the lattice constant of the second semiconductor material. In this way, compressive stress exists in the semiconductor wire, which is beneficial to improve the hole mobility. For example, the first semiconductor material includes germanium or silicon germanium, and for example, the entire first semiconductor material is germanium or is silicon germanium. For example, the second semiconductor material includes silicon, and for example, the entire second semiconductor material is silicon. For example, the material of the source electrode and the drain electrode includes a metal material, such as nickel, and for example, the material of the entire source electrode and the entire drain electrode is the metal material. Of course, the first semiconductor material, the second semiconductor material, and materials of the source electrode and drain electrode are not limited to the above-listed types.

For example, in a direction perpendicular to the axial direction of the semiconductor wire 1, both the source electrode 3 and the drain electrode 4 do not overlap with the semiconductor layer 2. It should be noted that in the embodiment illustrated in FIG. 2A and FIG. 2B, the source electrode 3 and the drain electrode 4 do not overlap with the semiconductor layer 2 in all directions perpendicular to the axial direction of the semiconductor wire. In this way, the control effect of the gate electric field of the nanowire transistor on the channel can be better enhanced. For example, in the embodiment illustrated in FIG. 2A and FIG. 2B, no gap is between the source electrode 3 and the semiconductor layer 2, and no gap is between the drain electrode 4 and the semiconductor layer 2, that is, the source electrode 3 and the drain electrode 4 respectively have a boundary with the semiconductor layer 2.

For example, the gate length $L_1$ of the nanowire transistor 10 is in a range of 5 nm-20 nm; the length $L_2$ of the semiconductor layer in the axial direction is in a range of 10 nm-30 nm; the lengths $L_3$ and $L_4$ of the source region and the drain region are both in a range of 10 nm-20 nm; the length L of the entire nanowire is in a range of 30 nm-70 nm; the width d of the semiconductor wire 1 in the lateral direction (perpendicular to the axial direction) is in a range of 10 nm-20 nm; the thickness $r_1$ of the semiconductor layer 1 in the axial direction is in a range of 2 nm-3 nm; the thickness $r_2$ of the gate oxide layer 5 described below in the direction perpendicular to the axial direction is in a range of 2 nm-15 nm. Of course, the above sizes are exemplary, and each structure is not limited to the above sizes, the embodiments of the present disclosure are not limited in this aspect.

For example, as illustrated in FIG. 2A and FIG. 2B, the source electrode 3 covers a nbbbbbbbbbbpart of the source region 102 of the semiconductor wire 1, and the drain electrode covers a part of the drain region 102 of the semiconductor wire 1. Of course, in other embodiments of the present disclosure, the source electrode 3 may also cover the entire source region 102 of the semiconductor wire 1, and the drain electrode 4 may cover the entire drain region 103 of the semiconductor wire 1. In this case, an area of the source electrode 3 directly contacting the semiconductor wire 1 and an area of the drain electrode 4 directly contacting the semiconductor wire 1 are large, which is beneficial to better achieve the above technical effects of the nanowire transistor provided by the embodiments of the present disclosure.

For example, as illustrated in FIG. 2A and FIG. 2B, the nanowire transistor 10 further includes a gate oxide layer 5 and a gate electrode 6. The gate oxide layer 5 covers the semiconductor layer 2; the gate electrode 6 covers the gate oxide layer 5, and along the axial direction of the semiconductor wire 1, two ends of the semiconductor layer 2 protrude from the gate oxide layer 5 and the gate electrode 6. For example, the material of the gate electrode is polysilicon. The gate electrode 6 in a cylindrical shape surrounding the semiconductor wire 1 can enhance the control ability of the gate electric field to the channel region 101, thereby effectively suppressing the short channel effect, and helping to reduce the size of the nanowire transistor.

For example, in the direction perpendicular to the axial direction of the semiconductor wire 1, the source electrode 3 does not overlap with the gate oxide layer 5 and the drain electrode 4 does not overlap with the gate oxide layer 5; in the direction perpendicular to the axial direction of the semiconductor wire 1, the source electrode 3 does not overlap with the gate electrode 6, and the drain electrode 4 does not overlap with the gate electrode 6. In this way, it is possible to avoid strong gate-induced current leakage of the drain electrode due to the overlap of the source electrode and drain electrode with the gate electrode, thereby improving the on-off state current ratio of the nanowire transistor.

For example, the source region 102 and the drain region 103 are doped with doping materials, for example uniform doped with boron, and for example, a doping concentration is in a range of $10^{18}$ cm$^{-3}$-$10^{19}$ cm$^{-3}$.

For example, the length of the channel region 101 is equal to the length $L_2$ of the semiconductor layer 2 in the axial direction of the semiconductor wire 1.

For example, the semiconductor wire 1 is in a columnar shape, and the semiconductor layer 2 is in a ring shape. For example, in the embodiment illustrated in FIG. 2A and FIG. 2B, the semiconductor wire 1 is in a cylindrical shape, and the semiconductor layer 2 is in an annular shape. Of course, the semiconductor wire is not limited to the cylindrical shape, and the semiconductor layer is not limited to the annular shape.

Figure 3A:
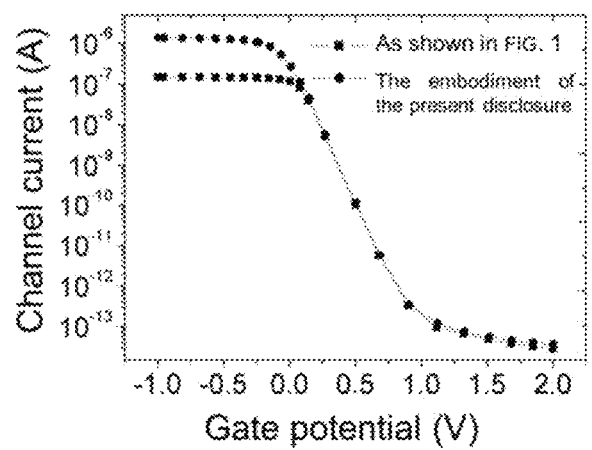
FIG. 3A shows transfer characteristic curves of the nanowire transistor illustrated in FIG. 1A and the nanowire transistor provided by an embodiment of the present disclosure.
Figure 3B:
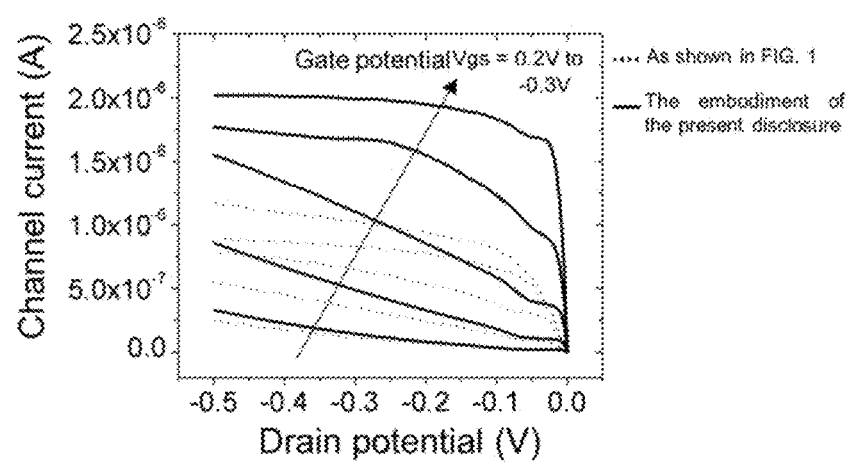
FIG. 3B shows output characteristic curves of the nanowire transistor illustrated in FIG. 1A and the nanowire transistor provided by an embodiment of the present disclosure.

In the following, taking the nanowire transistor illustrated in FIG. 2A and FIG. 2B as an example, the electrical characteristics of the nanowire transistor provided by the embodiments of the present disclosure and the electrical characteristics of the nanowire transistor illustrated in FIG. 1A are tested by a TCAD device simulation method, in order to specifically describe the technical effects of the embodiments of the present disclosure. For example, the gate length $L_1$ of the tested nanowire transistor is in a range of 5 nm-20 nm; the length $L_2$ of the semiconductor layer in the axial direction is in a range of 10 nm-30 nm; the thickness $r_1$ of the semiconductor layer in the direction perpendicular to the axial direction is in a range of 2 nm-5 nm, the thickness $r_2$ of the gate oxide layer in the direction perpendicular to the axial direction is in a range of 2 nm-15 nm. The first semiconductor material of the semiconductor wire of the tested nanowire transistor is germanium, the second semiconductor material of the semiconductor layer is silicon, the material of the source electrode and drain electrode is nickel, the material of the gate electrode is polysilicon, and the material of the gate oxide layer is silicon oxide. The work function of the material of the gate electrode is in a range of 4 eV-5 eV, and the nanowire is uniformly doped with acceptors, and the concentration is in a range of $10^{18}$ cm$^{-3}$-$10^{19}$ cm$^{-3}$. FIG. 3A shows transfer characteristic curves of the nanowire transistor illustrated in FIG. 1A and the nanowire transistor provided by an embodiment of the present disclosure; and FIG. 3B shows output characteristic curves of the nanowire transistor illustrated in FIG. 1A and the nanowire transistor provided by an embodiment of the present disclosure. In FIG. 3B, the solid line represents the current data of the nanowire transistor provided by the embodiment of the present disclosure, and the dotted line represents the current data of the nanowire transistor illustrated in FIG. 1A.

As illustrated in FIG. 3A and FIG. 3B, it can be seen from the transfer characteristic curves that, the on-off current ratio of the nanowire transistor provided by the embodiment of the present disclosure is increased by 10 times; and it can be seen from the output characteristic curves that, in the linear region, the on-state resistance of the nanowire transistor provided by the embodiment of the present disclosure is smaller, and the output current increases more rapidly.

The improvement of the electrical characteristics of the nanowire transistor provided by the embodiments of the present disclosure can also be directly reflected from the improvement in the carrier density distribution, the electric potential distribution, and the lateral current density.

Figure 3C:
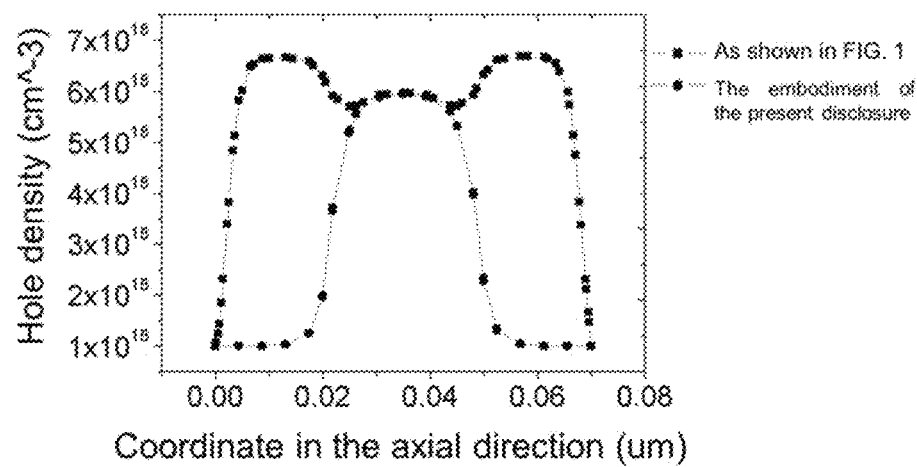
FIG. 3C shows a hole density distribution curve along an axial direction of a center line of a germanium core of the nanowire transistor illustrated in FIG. 1A and a hole density distribution curve along an axial direction of a center line of a semiconductor wire of the nanowire transistor provided by an embodiment of the present disclosure.
Figure 3D:
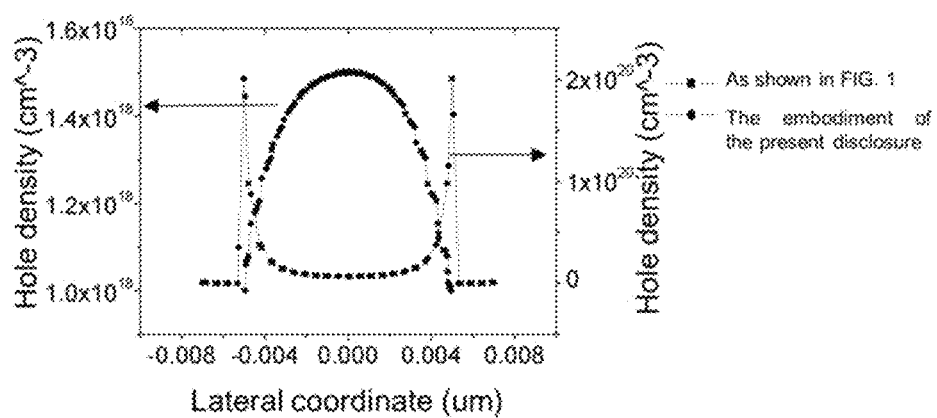
FIG. 3D shows a hole density distribution curve along a lateral direction at the boundary of a drain electrode and a silicon shell of the nanowire transistor illustrated in FIG. 1A and a hole density distribution curve along a lateral direction at the boundary of a drain electrode and a semiconductor layer of the nanowire transistor provided by an embodiment of the present disclosure.

FIG. 3C shows a hole density distribution curve along an axial direction of a center line of a germanium core of the nanowire transistor illustrated in FIG. 1A and a hole density distribution curve along an axial direction of a center line of a semiconductor wire of the nanowire transistor provided by an embodiment of the present disclosure; FIG. 3D shows a hole density distribution curve along a lateral direction at the boundary of a drain electrode and a silicon shell of the nanowire transistor illustrated in FIG. 1A and a hole density distribution curve along a lateral direction at the boundary of a drain electrode and a semiconductor layer of the nanowire transistor provided by an embodiment of the present disclosure.

As illustrated in FIG. 3C, there is a sudden change in the density distribution near the source region and the drain region of the nanowire transistor illustrated in FIG. 1A (the coordinate in the axial direction is about 0 μm-0.02 μm). In the nanowire transistor provided by the embodiment of the present disclosure, the hole density of the source electrode and the hole density of drain electrode change smoothly, and the holes are concentrated in the channel region (the coordinate in the axial direction is about in a range of 0.02 μm-0.06 μm). As illustrated in FIG. 3D, (taking the center of the cross section of the semiconductor wire perpendicular to the axial direction thereof as the origin of coordinates, for example, the image of the cross section is in a circle shape, and the center of the circle shape is the left origin), in the nanowire transistor illustrated in FIG. 1A, there is a step change in hole density at the boundary of the germanium core and the silicon shell (the lateral coordinates are about in a range of −0.005 μm and 0.005 μm), this is because the holes are mainly concentrated in the quantum potential well on the surface of the germanium core (the interface with the silicon shell) and are depleted in the silicon shell, and this distribution forms a hole diffusion flow from the surface to the center of the germanium core. In the nanowire transistor provided by the embodiment of the present disclosure, the situation is that: the holes are concentrated in the center of the cross section (the lateral coordinate is about 0 μm) and gradually attenuate toward the surface of the semiconductor wire, which drives the lateral holes diffusion flow from the center of the cross section to the surface of the semiconductor wire. Therefore, the nanowire transistor provided by the embodiment of the present disclosure is more beneficial to the collection of the lateral current of the drain electrode.

Figure 3E:
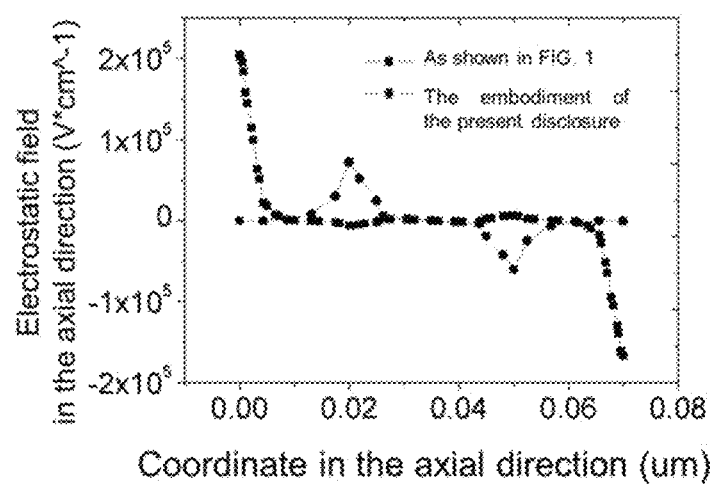
FIG. 3E shows electrostatic field distribution curves of a driving drift current along the axial direction of a center line of the semiconductor wire in the nanowire transistor illustrated in FIG. 1A and the nanowire transistor provided by an embodiment of the present disclosure.

In the nanowire transistor, the electrostatic field distribution along the axial direction of the driving drift current on the center line of the semiconductor wire is illustrated in FIG. 3E. The voltage conditions are gate voltage Vgs=−0.5V, drain voltage Vds=−0.01V. It can be seen from FIG. 3E that both the source region of the nanowire transistor and drain region of the nanowire transistor illustrated in FIG. 1A have a relatively high electrostatic field. Because of the potential difference between the gate electrode and the drain electrode, an electrostatic field exists in the drain region, and the direction of this electrostatic field is opposite to the drift direction of the holes. In this case, a diffusion current is required to offset this reverse electric field. In the nanowire transistor provided by the embodiment of the present disclosure, the high electric field only exists at the boundary of the source region and the channel region and the boundary of the source region and the channel region. In this case, there is no need of the diffuse current in the drain region for offsetting the reverse electric field, which is beneficial to increase the on-state current of the nanowire transistor, thereby increasing the on-off state current ratio.

Figure 3F:
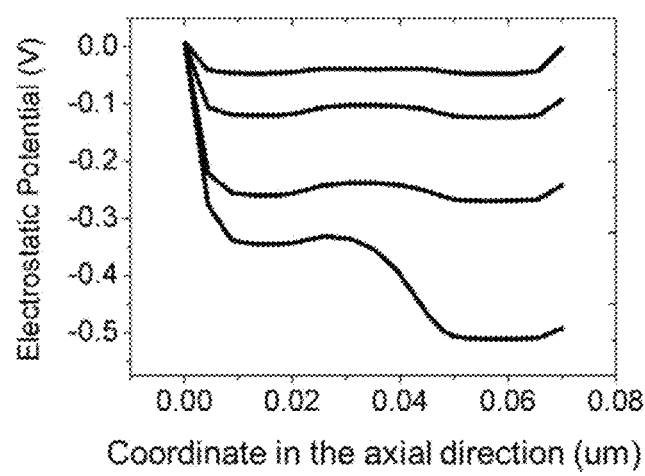
FIG. 3F shows a potential distribution diagram along the axial direction of the center line of the germanium core of the nanowire transistor illustrated in FIG. 1A.
Figure 3G:
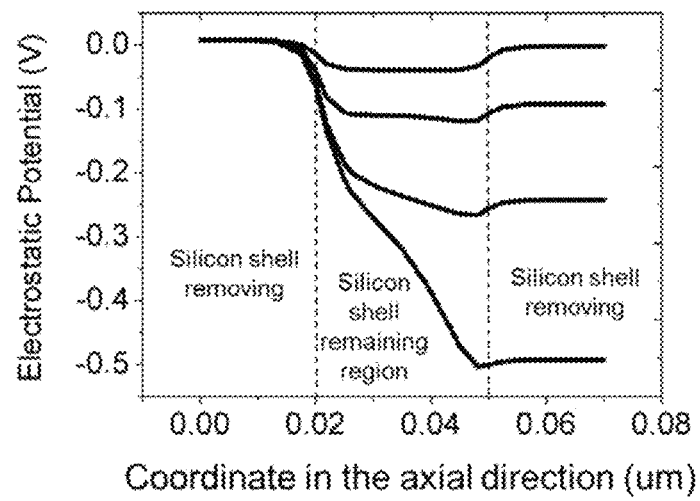
FIG. 3G shows a potential distribution diagram along the axial direction of the center line of the semiconductor wire of the nanowire transistor provided by an embodiment of the present disclosure.

In the nanowire transistor provided by the embodiment of the present disclosure, because both the source electrode and drain electrode are in direct contact with the semiconductor wire, the improvement in the potential distribution is mainly reflected in the enhancement of the control to the channel performed by the gate electric field. FIG. 3F shows a potential distribution diagram along an axial direction of a center line of a germanium core of the nanowire transistor illustrated in FIG. 1A; and FIG. 3G shows a potential distribution diagram along an axial direction of a center line of a semiconductor wire of the nanowire transistor provided by an embodiment of the present disclosure. As illustrated in FIG. 3F and FIG. 3Q the potential drop of the source electrode and drain electrode is in the length of the entire nanowire transistor illustrated in FIG. 1A (that is, the length of the germanium core along its axial direction, and the coordinate in the axial direction is about in a range of 0.00 μm-0.08 μm). In the nanowire transistor provided by the embodiment of the present disclosure, the potential drop mainly exists in the channel region (the coordinate in the axial direction is about in a range of 0.02 μm-0.06 μm).

Figure 3H:
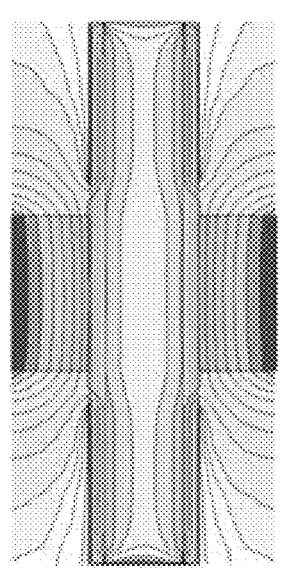
FIG. 3H is a distribution diagram of equipotential lines along the axial direction of the center line of the germanium core of the nanowire transistor illustrated in FIG. 1A.
Figure 3I:
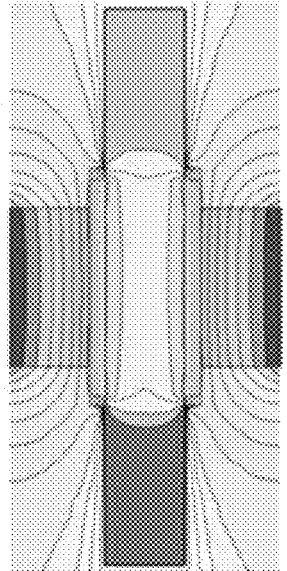
FIG. 3I is a distribution diagram of equipotential lines along the axial direction of the center line of the nanowire transistor provided by an embodiment of the present disclosure.

The above potential distribution can also be directly reflected from the distribution diagram of equipotential lines. FIG. 3H is a distribution diagram of equipotential lines along the axial direction of the center line of the germanium core of the nanowire transistor illustrated in FIG. 1A; and FIG. 3I is a distribution diagram of equipotential lines along the axial direction of the center line of the nanowire transistor provided by an embodiment of the present disclosure. As illustrated in FIG. 3H and FIG. 3I, the equipotential lines in the structure illustrated in FIG. 1A run through the entire nanowire including the source region and drain region. In the structure provided by the embodiment of the present disclosure, the equipotential lines are mainly concentrated in the channel region covered by the gate electrode.

Figure 3J:
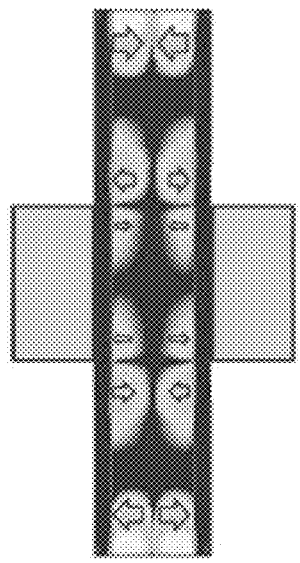
FIG. 3J is an on-state lateral current distribution diagram of the nanowire transistor illustrated in FIG. 1A.
Figure 3K:
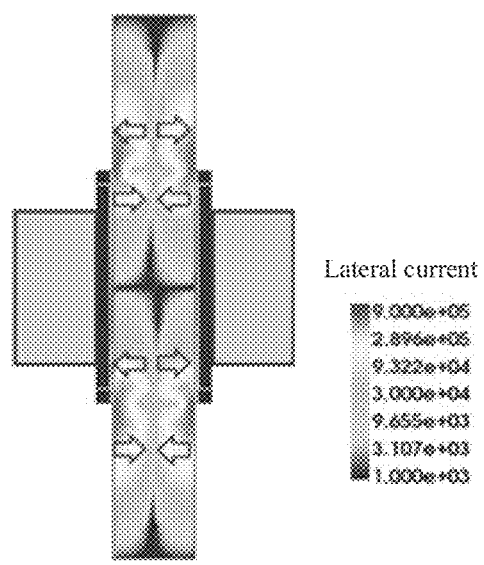
FIG. 3K is an on-state lateral current distribution diagram of the nanowire transistor provided by an embodiment of the disclosure.

In the nanowire transistor provided by the embodiments of the present disclosure, because of the quantum potential well effect caused by band bias (for example, in the case where the first semiconductor material of the semiconductor wire is the germanium material and the second semiconductor material of the semiconductor layer is the silicon material, the band difference of germanium material and silicon material forms the band bias of type II), the holes in the semiconductor layer are depleted, and the semiconductor layer becomes a negatively charged space charge layer, thereby forming a lateral electrostatic field directed from the center of the semiconductor wire to the surface. The lateral electric field combined with the hole density gradient drives the formation of lateral current in the semiconductor wire. FIG. 3J is an on-state lateral current distribution diagram of the nanowire transistor illustrated in FIG. 1A; and FIG. 3K is an on-state lateral current distribution diagram of the nanowire transistor provided by an embodiment of the disclosure. The direction of the lateral current is indicated by the arrows. According to FIG. 3J and FIG. 3K, it can be seen that in the nanowire transistor illustrated in FIG. 1A, the lateral current is limited in the semiconductor wire, however, the nanowire transistor provided by the embodiment of the present disclosure obtains a higher lateral current, moreover, the silicon shell at the drain end is stripped off, which is beneficial to collecting the lateral current by the drain electrode, that is, beneficial to increasing the lateral current, thereby increasing the on-state current.

Figure 2C:
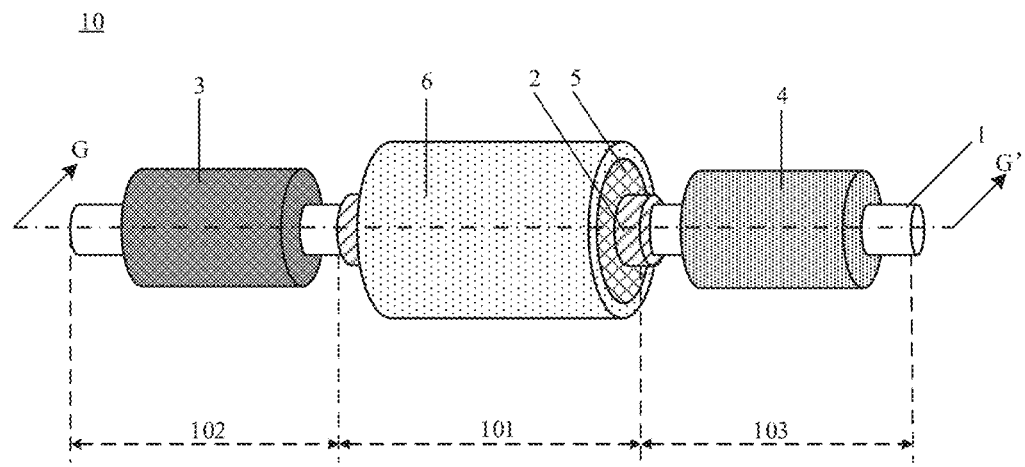
FIG. 2C is a schematic diagram of a three-dimensional structure of another nanowire transistor provided by an embodiment of the present disclosure.
Figure 2D:
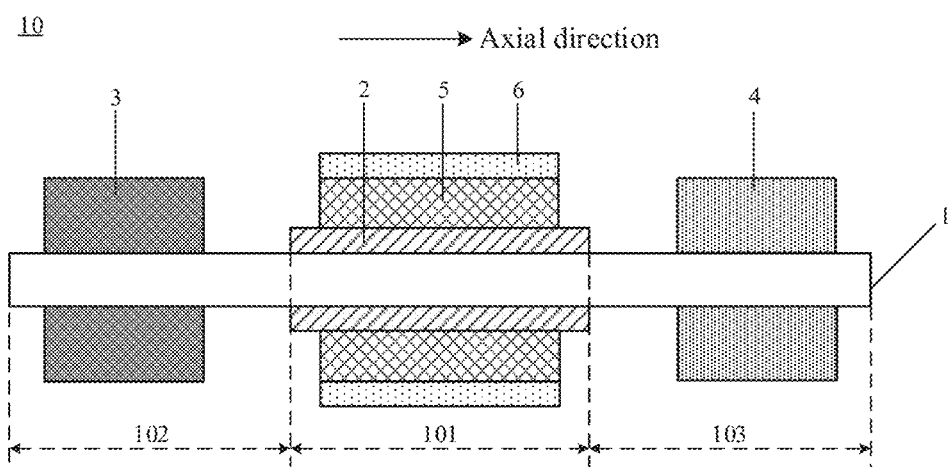
FIG. 2D is a cross-sectional diagram taken along a line G-G' in FIG. 2C.

For example, FIG. 2C is a schematic diagram of a three-dimensional structure of another nanowire transistor provided by an embodiment of the present disclosure; and FIG. 2D is a cross-sectional diagram taken along a line G-G' in FIG. 2C. In FIG. 2C and FIG. 2D, the difference between the nanowire transistor 10 and the nanowire transistor in FIG. 2A and FIG. 2B is that a gap is between the source electrode 3 and the semiconductor layer 2 and a gap is between the drain electrode 4 and the semiconductor layer 2. The other features of the nanowire transistor 10 are the same as those illustrated in FIG. 2A and FIG. 2B, and the nanowire transistor 10 can achieve the same or similar technical effects as the transistor illustrated in FIG. 2A and FIG. 2B. Please refer to the above descriptions and the same content is not repeated here.

Figure 2E:
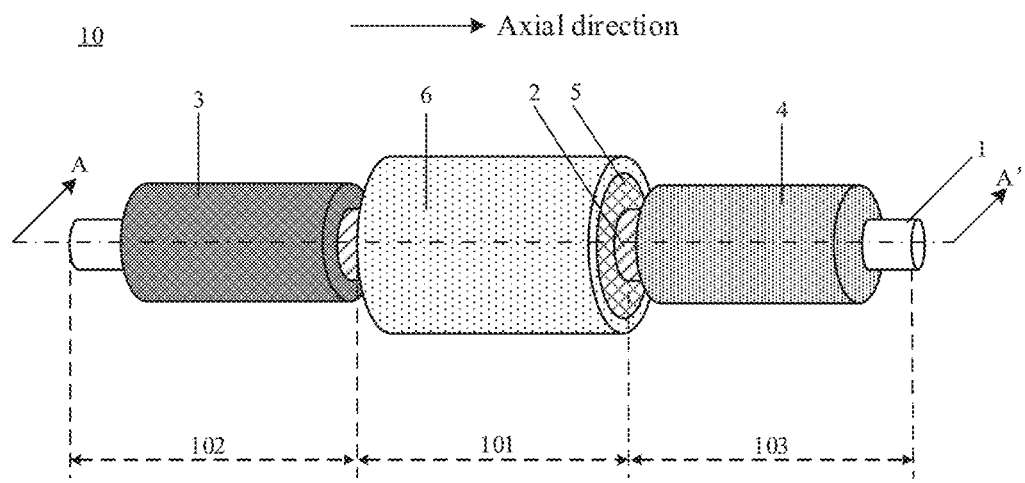
FIG. 2E is a schematic diagram of a three-dimensional structure of further another nanowire transistor provided by an embodiment of the present disclosure.
Figure 2F:
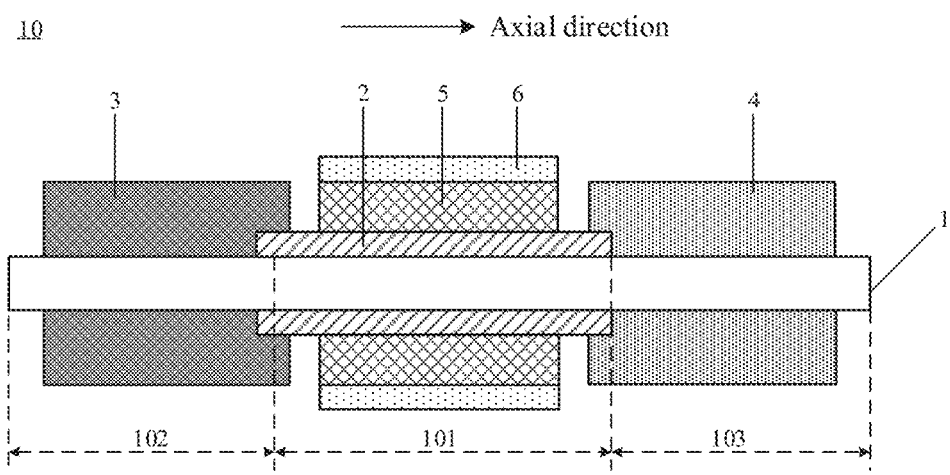
FIG. 2F is a cross-sectional diagram taken along a line A-A' in FIG. 2E.

For example, FIG. 2E is a schematic diagram of a three-dimensional structure of further another nanowire transistor provided by an embodiment of the present disclosure; and FIG. 2F is a cross-sectional diagram taken along a line A-A' in FIG. 2E. In FIG. 2E and FIG. 2F, the difference between the nanowire transistor 10 and the nanowire transistor in FIG. 2A and FIG. 2B is that in the direction perpendicular to the axial direction of the semiconductor wire 1, one portion of the source electrode 3 and one portion of the drain electrode 4 do not overlap with the semiconductor layer 2, and the other portion of the source electrode 3 and the other portion of the drain electrode 4 overlap with the semiconductor layer 2. The other features of the nanowire transistor 10 illustrated in FIG. 2E and FIG. 2F are the same as those illustrated in FIG. 2A and FIG. 2B, and the nanowire transistor 10 can achieve the same or similar technical effects as the transistor illustrated in FIG. 2A and FIG. 2B. Please refer to the above descriptions and the same content is not repeated here.

Figure 2G:
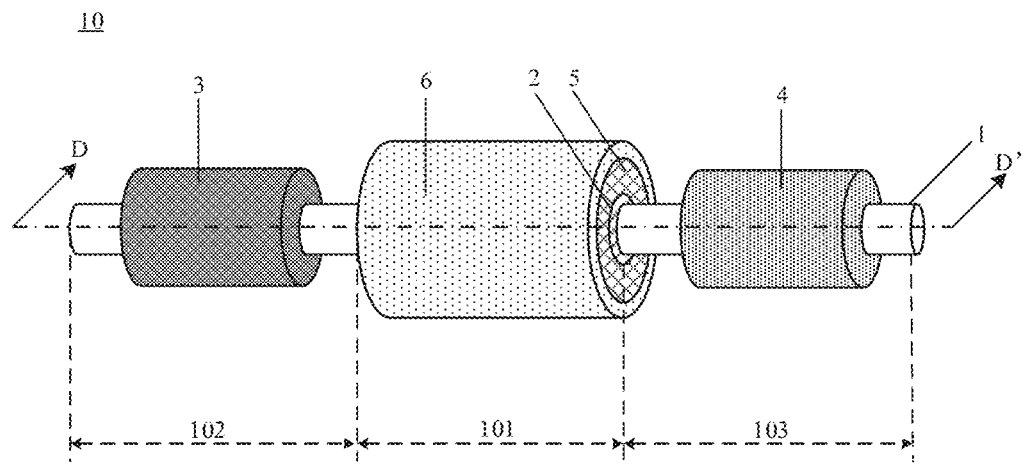
FIG. 2G is a schematic diagram of a three-dimensional structure of further another nanowire transistor provided by an embodiment of the present disclosure.
Figure 2H:
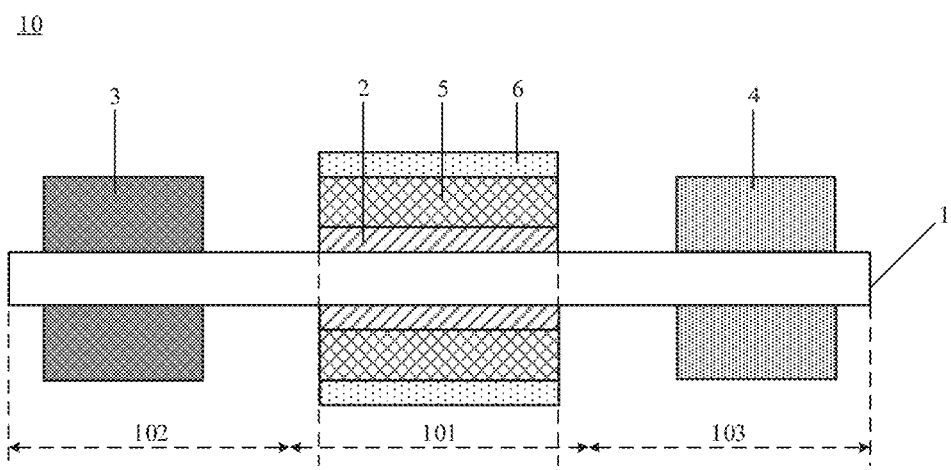
FIG. 2H is a cross-sectional diagram taken along a line D-D' in FIG. 2G.

For example, FIG. 2G is a schematic diagram of a three-dimensional structure of further another nanowire transistor provided by an embodiment of the present disclosure; and FIG. 2H is a cross-sectional diagram taken along a line D-D' in FIG. 2G In FIG. 2G and FIG. 2H, the difference between the nanowire transistor 10 and the nanowire transistor in FIG. 2A and FIG. 2B is that along the axial direction of the semiconductor wire 1, two ends of the semiconductor layer 2 are respectively flush with two ends of the gate electrode 6. The other features of the nanowire transistor 10 illustrated in FIG. 2E and FIG. 2F are the same as those illustrated in FIG. 2A and FIG. 2B, the nanowire transistor 10 can achieve the same or similar technical effects as the transistor illustrated in FIG. 2A and FIG. 2B. Please refer to the above descriptions and the same content is not repeated here.

Figure 4A:
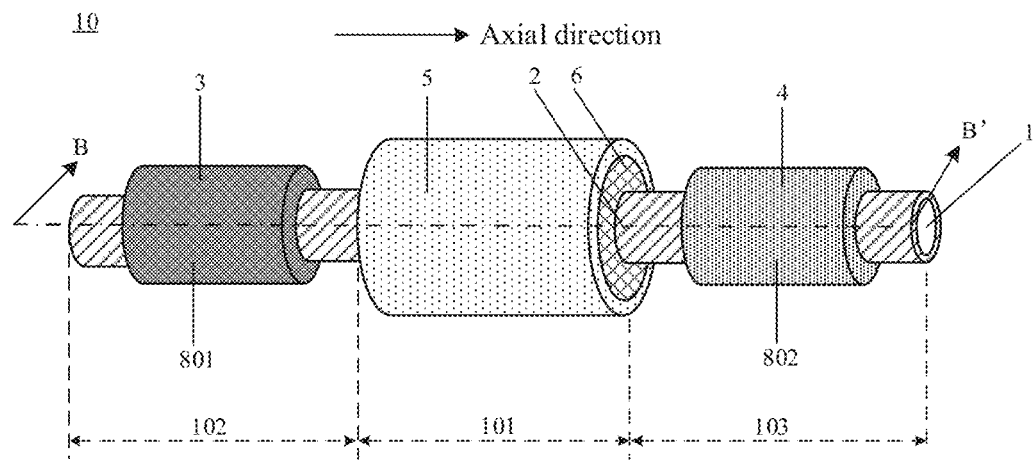
FIG. 4A is a schematic diagram of a three-dimensional structure of further another nanowire transistor provided by an embodiment of the present disclosure.
Figure 4B:
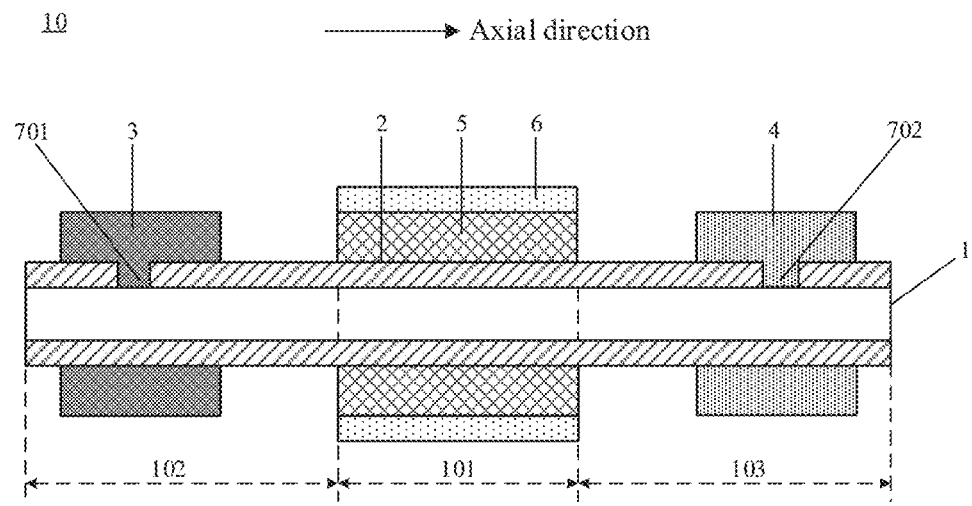
FIG. 4B is a cross-sectional diagram taken along a line B-B' in FIG. 4A.

For example, FIG. 4A is a schematic diagram of a three-dimensional structure of further another nanowire transistor provided by an embodiment of the present disclosure; and FIG. 4B is a cross-sectional diagram taken along a line B-B' in FIG. 4A. In FIG. 4A and FIG. 4B, the difference between the nanowire transistor 10 and the nanowire transistor in FIGS. 2A and 2B FIG. is that the semiconductor layer 2 covers the source region 102 of the semiconductor wire 1 and the drain region 103 of the semiconductor wire 1; a portion of the semiconductor layer 2 in the source region 102 includes a first via hole 701 penetrating the semiconductor layer 2, a portion of the semiconductor layer 2 in the drain region 103 includes a second via hole 702 penetrating the semiconductor layer 2. The source electrode 3 directly contacts the source region 102 of the semiconductor wire 1 through the first via hole 701; and the drain electrode directly contacts the drain region 103 of the semiconductor wire 1 through the second via hole 702. In this case, the length of the channel region 101 is equal to the length of the gate electrode 6. The other features of the nanowire transistor 10 illustrated in FIG. 4A and FIG. 4B are the same as those illustrated in FIG. 2A and FIG. 2B, the nanowire transistor 10 can achieve the same or similar technical effects as the transistor illustrated in FIG. 2A and FIG. 2B. Please refer to the above descriptions and the same content is not repeated here.

Figure 5A:
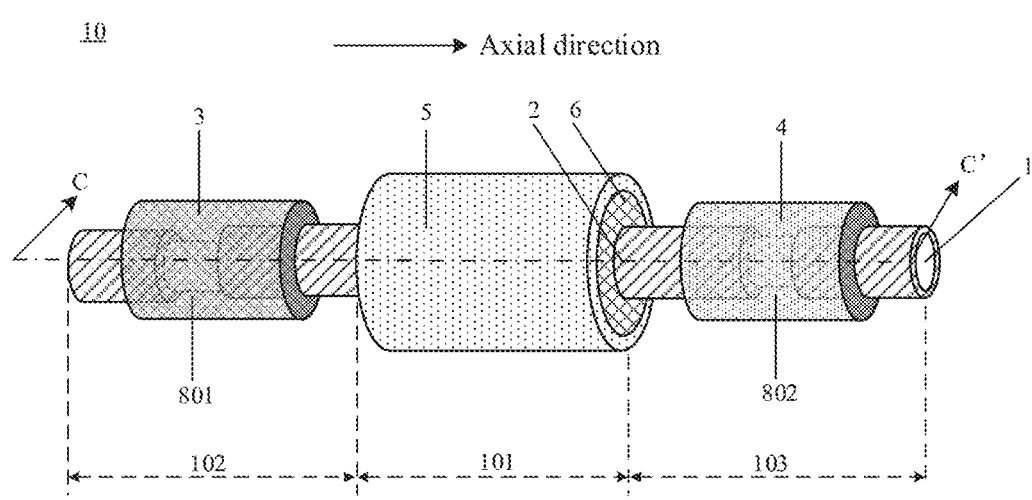
FIG. 5A is a schematic diagram of a three-dimensional structure of further another nanowire transistor provided by an embodiment of the present disclosure.
Figure 5B:
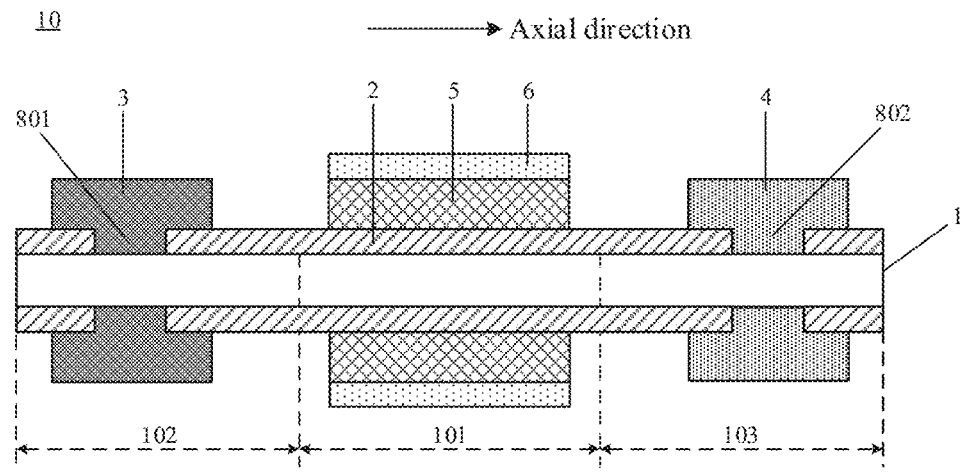
FIG. 5B is a cross-sectional diagram taken along a line C-C' in FIG. 2G.

FIG. 5A is a schematic diagram of a three-dimensional structure of further another nanowire transistor provided by an embodiment of the present disclosure; and FIG. 5B is a cross-sectional diagram taken along a line C-C' in FIG. 2G In FIG. 5A and FIG. 5B, the difference between the nanowire transistor 10 and the nanowire transistor in FIG. 2A and FIG. 2B is that the semiconductor layer 2 covers the source region 102 of the semiconductor wire 1 and the drain region 103 of the semiconductor wire 1, and a portion of the semiconductor layer 2 in the source region 102 includes a first groove 801 penetrating the semiconductor layer 2 and surrounding the semiconductor wire 1, and a portion of the semiconductor layer 2 in the drain region 103 includes a second groove 802 penetrating the semiconductor layer 2 and surrounding the semiconductor wire 1. The source electrode 3 directly contacts the source region 102 of the semiconductor wire 1 through the first groove 801; and the drain electrode 4 directly contacts the drain region 103 of the semiconductor wire 1 through the second groove 802. The nanowire transistor 10 illustrated in FIG. 5A and FIG. 5B can also achieve the same or similar technical effects as the transistor illustrated in FIG. 2A and FIG. 2B.

At least one embodiment of the present disclosure further provides a manufacture method of a nanowire transistor, the manufacture method includes: providing a semiconductor wire, in which the semiconductor wire includes a source region, a drain region, and a channel region, along an axial direction of the semiconductor wire, the channel region is between the source region and the drain region; forming a semiconductor layer, in which the semiconductor layer includes a second semiconductor material and covers the channel region of the semiconductor wire; and forming a source electrode and a drain electrode, in which the source electrode is in the source region of the semiconductor wire and is in direct contact with the source region of the semiconductor wire, and the drain electrode is in the drain region of the semiconductor wire and is in direct contact with the drain region of the semiconductor wire.

Figure 6A:
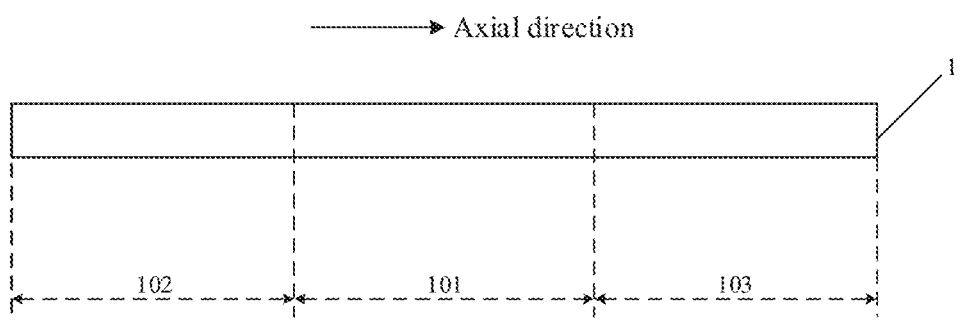
FIGS. 6A-6I are schematic diagrams of a manufacture method of a nanowire transistor provided by an embodiment of the present disclosure.

Exemplarily, FIGS. 6A-6I are schematic diagrams of a manufacture method of a nanowire transistor provided by an embodiment of the present disclosure. As illustrated in FIG. 6A, a semiconductor wire 1 is provided. The semiconductor wire 1 includes a first semiconductor material and includes a channel region 101, a source region 102, and a drain region 103. Along an axial direction of the semiconductor wire 1, the channel region 101 is between the source region 102 and the drain region 103. For example, the first semiconductor material is germanium or silicon germanium.

For example, in one embodiment of the present disclosure, forming the semiconductor layer includes: forming a semiconductor material layer covering the semiconductor wire; and removing portions of the semiconductor material layer covering the source region and the drain region by a patterning process to form the semiconductor layer. For example, the semiconductor layer is formed first, and then the source electrode and drain electrode are formed.

Figure 6B:
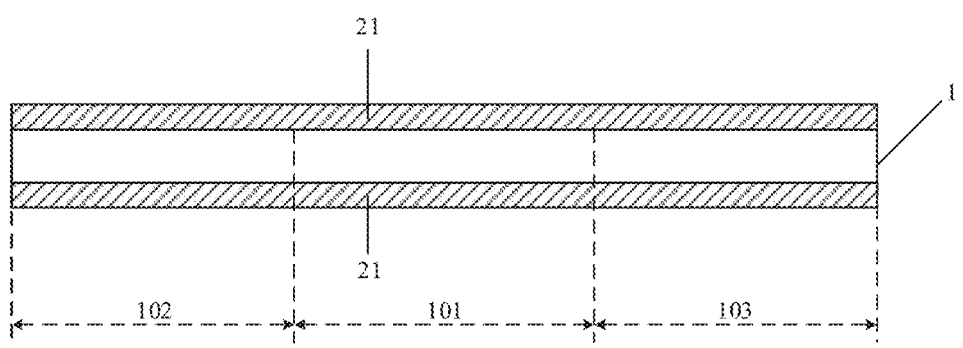

For example, as illustrated in FIG. 6B, a semiconductor material layer 21 covering the semiconductor wire 1 is formed for subsequent formation of the semiconductor layer. For example, the semiconductor material layer 21 includes a second semiconductor material, for example, the second semiconductor material is silicon. For example, a deposition method is adopted to form the semiconductor material layer. For example, an epitaxial method is adopted to form the semiconductor material layer, and the material of the semiconductor material layer has a single crystal structure, such as single crystal silicon. For example, the thickness of the semiconductor material layer 21 is in a range of 2 nm-3 nm.

Figure 6C:
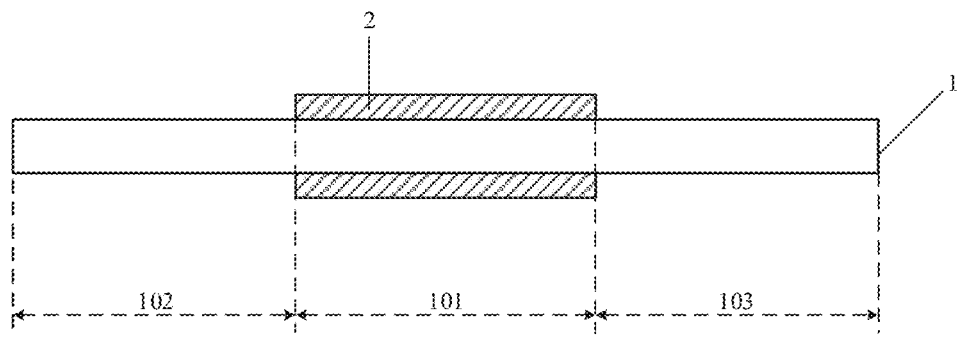

As illustrated in FIG. 6C, a patterning process, such as a photolithography process, is adopted to pattern the semiconductor material layer 21, and the portions of the semiconductor material layer 21 covering the source region 102 and the drain region 103 are removed to form a semiconductor layer 2. The semiconductor layer 2 includes a second semiconductor material and covers the channel region 101 of the semiconductor wire 1.

For example, forming the source electrode and the drain electrode includes: forming the source electrode in the source region after the portions of the semiconductor material layer are removed; and forming the drain electrode in the drain region after the portions of the semiconductor material layer are removed. In a direction perpendicular to the axial direction of the semiconductor wire, the source electrode and the drain electrode do not overlap with the semiconductor layer. In this way, since the source electrode and drain electrode are in direct contact with the semiconductor wire, the control effect of the gate electric field on the channel is strengthened, thereby avoiding or reducing gate-induced current leakage of the drain electrode, which is beneficial to improve the on-off state current ratio of the nanowire transistor.

Figure 6D:
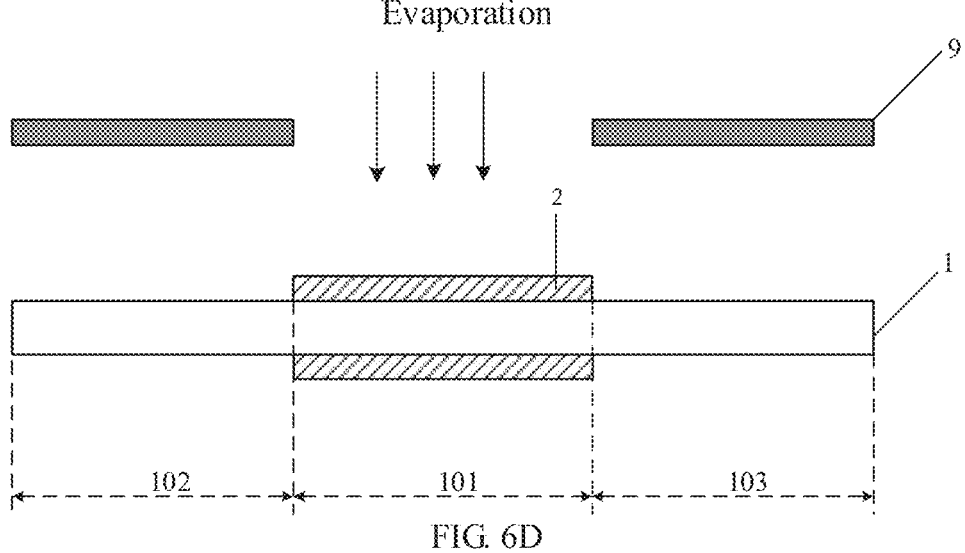
Figure 6E:
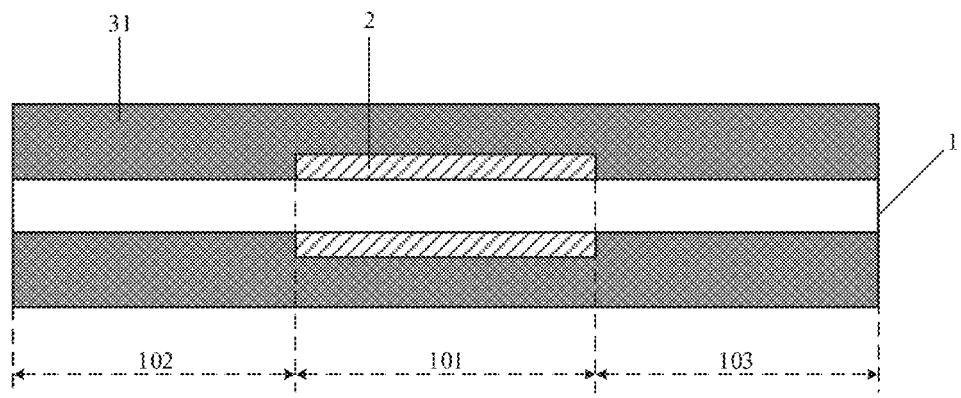

Exemplarily, after the semiconductor layer 2 is formed, as illustrated in FIG. 6E, a source/drain material layer 31 covering the semiconductor wire 1 and the semiconductor layer 2 is formed. For example, the material of the source/drain material layer 31 is metal, for example, nickel, etc. Of course, it is not limited to nickel. For example, the source/drain material layer 31 is formed by a deposition or evaporation method. Then, a rapid thermal annealing process is performed on the source/drain material layer 31, so that the source/drain material layer 31 reacts with the second semiconductor material of the semiconductor layer 2 to form nickel silicide, for example.

Figure 6F:
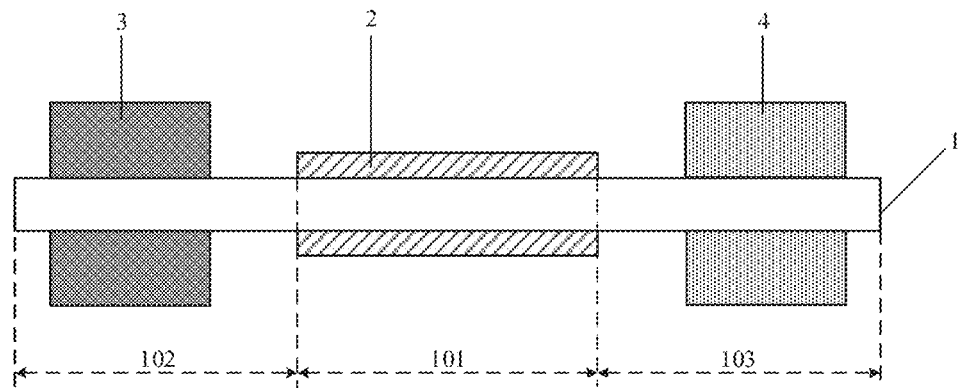

As illustrated in FIG. 6F, a patterning process, such as a photolithography process, is used to pattern the source/drain material layer 31 to form the source electrode 3 and the drain electrode 4 at the same time (that is, the source electrode 3 and the drain electrode 4 are formed in the same patterning process). In a direction perpendicular to the axial direction of the semiconductor wire 1, both the source electrode 3 and the drain electrode 4 do not overlap with the semiconductor layer 2. In the embodiment illustrated in FIG. 6F, both the source electrode 3 and the drain electrode 4 do not overlap with the semiconductor layer 2 in all directions perpendicular to the axial direction of the semiconductor wire 1. In this way, the control effect of the gate electric field of the nanowire transistor on the channel can be better enhanced. The source electrode 3 covers a part of the source region 102 of the semiconductor wire 1, and the drain electrode 4 covers a part of the drain region 103 of the semiconductor wire 1, so that the entire source electrode 3 and the entire drain electrode 4 are in direct contact with the semiconductor wire 1 to better achieve the above technical effects.

As illustrated in FIG. 6Q the manufacture method of the nanowire transistor further includes: forming a gate oxide layer 5 covering the semiconductor layer 2. Along the axial direction of the semiconductor wire 1, two ends of the semiconductor layer 2 protrude from the gate oxide layer 5.

For example, a deposition method combined with a photolithography method can be used to form the gate oxide layer 5.

Figure 6G:
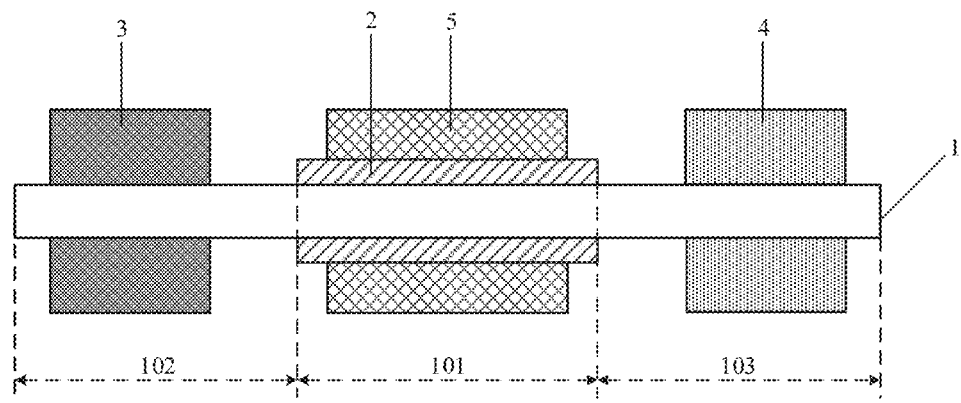
Figure 6H:
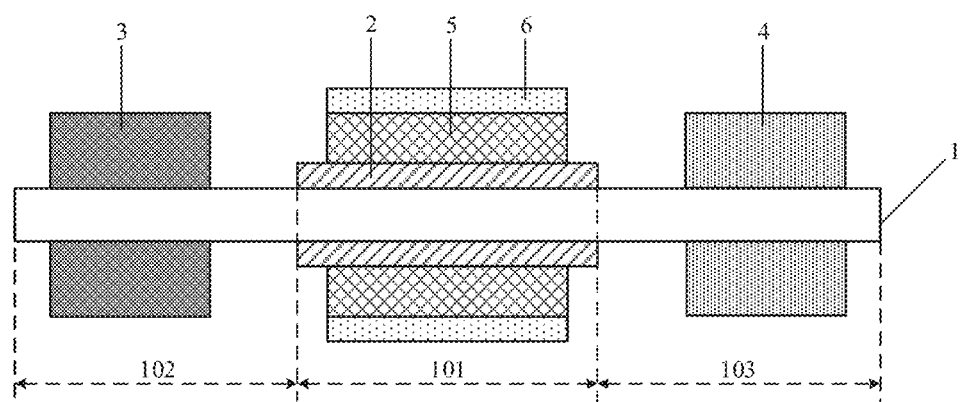

As illustrated in FIG. 6H, the manufacture method of the nanowire transistor further includes: forming a gate electrode 6 covering the gate oxide layer 5. Along the axial direction of the semiconductor wire 1, two ends of the semiconductor layer 2 protrude from the gate electrode 6. For example, the gate electrode 6 can be formed by a deposition or evaporation method combined with a photolithography method.

Figure 6I:
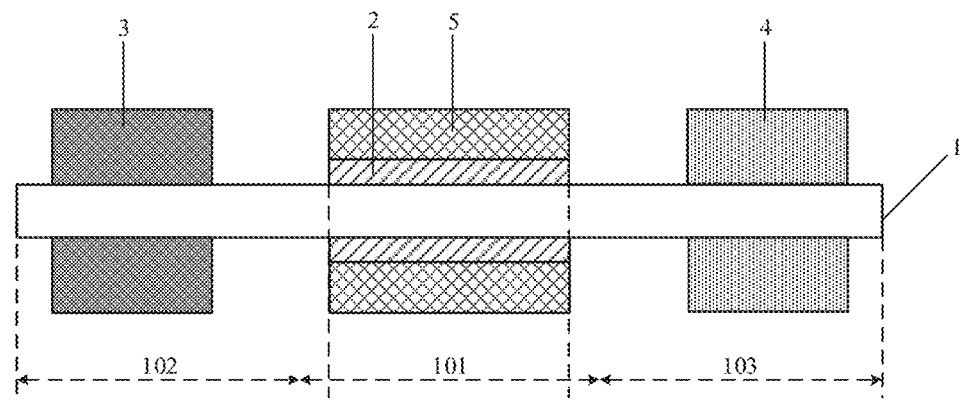

For example, the method of forming the gate oxide layer 5 may also be as illustrated in FIG. 6I. For example, the gate oxide layer 5 may be formed by a photolithography method, and along the axial direction of the semiconductor wire 1, two ends of the semiconductor layer 2 are respectively flush with two ends of the gate electrode 6. For example, the semiconductor layer 2 is heated in an oxygen environment to oxidize the surface of the semiconductor layer 2 to form a gate oxide layer 5 covering the semiconductor layer 2 on the surface of the semiconductor layer 2.

For example, in the direction perpendicular to the axial direction of the semiconductor wire 1, the source electrode 3 does not overlap with the gate oxide layer 5, and the drain electrode 4 does not overlap with the gate oxide layer 5; in the direction perpendicular to the axial direction of the semiconductor wire 1, the source electrode 3 does not overlap with the gate electrode 6, and the drain electrode 4 does not overlap with the gate electrode 6. In this way, it is possible to avoid the strong gate-induced current leakage of the drain electrode caused by the overlap of portions of both of the source electrode 3 and the drain electrode 4 with the gate electrode, thereby increasing the on-off state current ratio of the nanowire transistor.

It should be noted that, in another embodiment of the present disclosure, as illustrated in FIG. 6D, the above semiconductor material layer 21 may not be formed, and the above semiconductor layer 2 may be directly deposited on the semiconductor wire 1 with an evaporation mask 9.

Figure 7A:
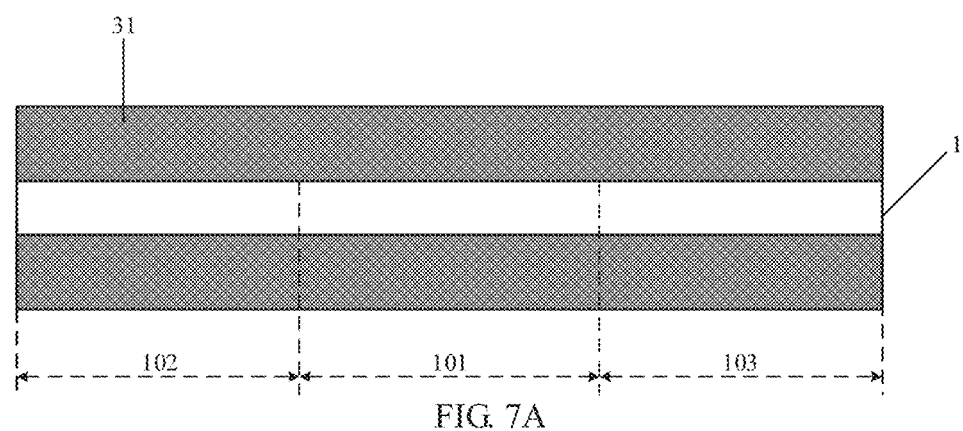
FIGS. 7A-7D are schematic diagrams of a manufacture method of another nanowire transistor provided by an embodiment of the present disclosure.
Figure 7B:
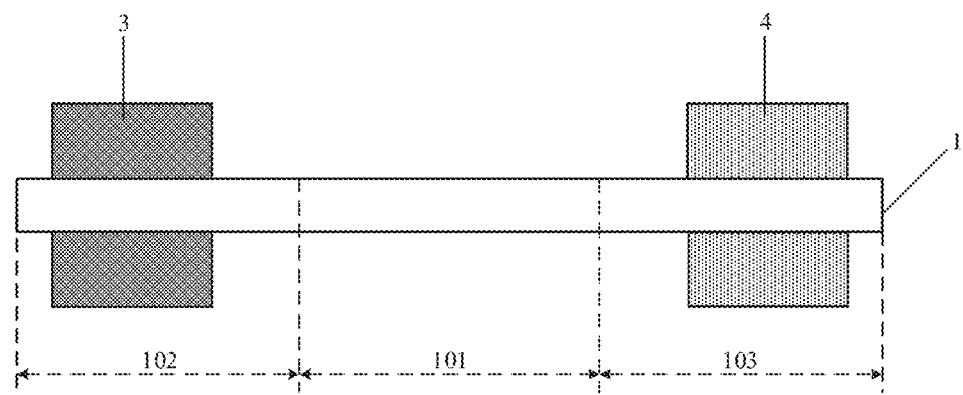

FIGS. 7A-7D are schematic diagrams of a manufacture method of another nanowire transistor provided by an embodiment of the present disclosure. The difference between this method and the method illustrated in FIGS. 6A-6H is that the source electrode and the drain electrode are formed first, and then the semiconductor layer is formed. As illustrated in FIG. 7A, after the semiconductor wire 1 illustrated in FIG. 6A is provided, a source/drain material layer 31 covering the semiconductor wire 1 is formed, and the source/drain material layer 31 is patterned to simultaneously form the source electrode 3 and the drain electrode 4 (that is, the source electrode 3 and the drain electrode 4 are formed in the same patterning process). The source electrode 3 covers the source region 102 of the semiconductor wire 1, and the drain electrode 4 covers the drain region 103 of the semiconductor wire 1.

Figure 7C:
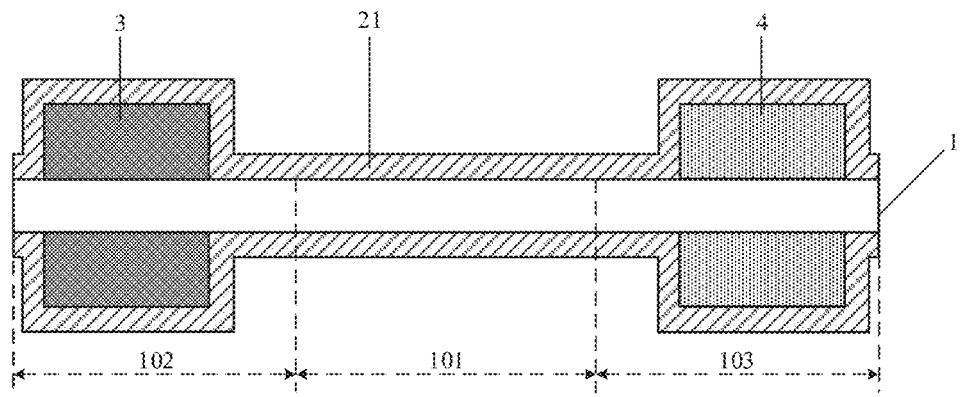

As illustrated in FIG. 7C, a semiconductor material layer 21 covering the semiconductor wire 1, the source electrode 3 and the drain electrode 4 is formed. For the specific forming method and material, please refer to the previous descriptions.

Figure 7D:
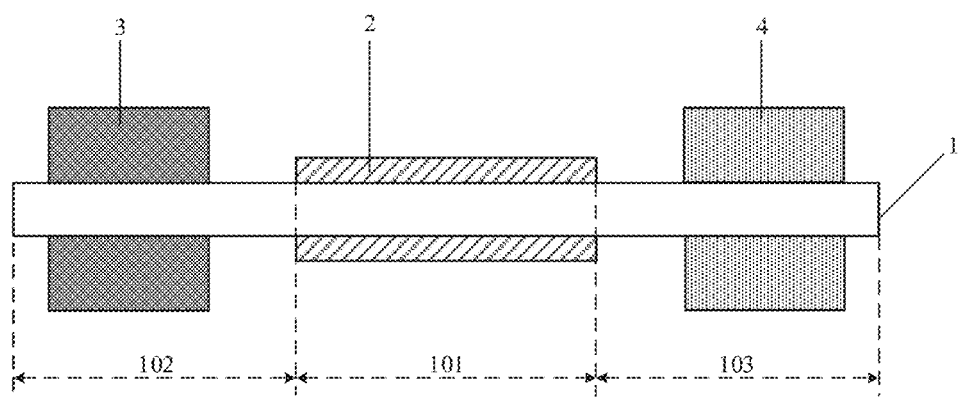

As illustrated in FIG. 7D, the semiconductor material layer 21 is patterned, and the portions of the semiconductor material layer 21 covering the source region 102 and the drain region 103 are removed to form a semiconductor layer 2. The semiconductor layer 2 includes a second semiconductor material and covers the channel region 101 of the semiconductor wire 1. The gate oxide layer and the gate electrode can be formed by the same method as that of FIG. 6G and FIG. 6H, so as to obtain the nanowire transistor illustrated in FIG. 6H.

Figure 8A:
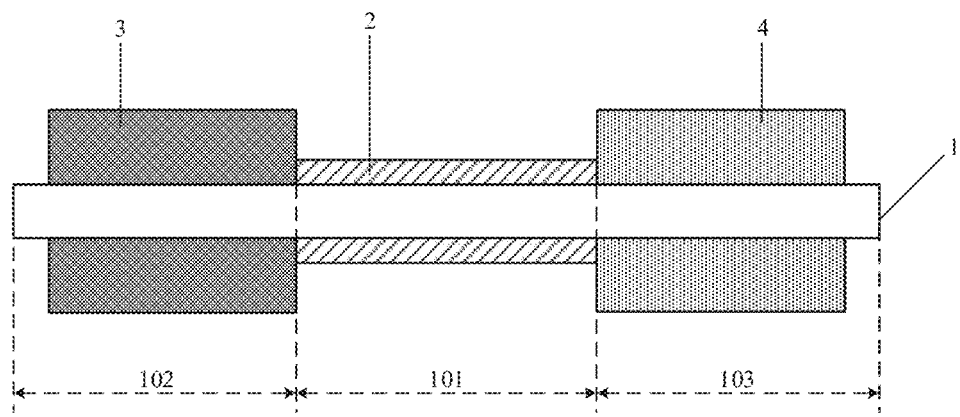
FIGS. 8A-8C are schematic diagrams of a manufacture method of further another nanowire transistor provided by an embodiment of the present disclosure.
Figure 8B:
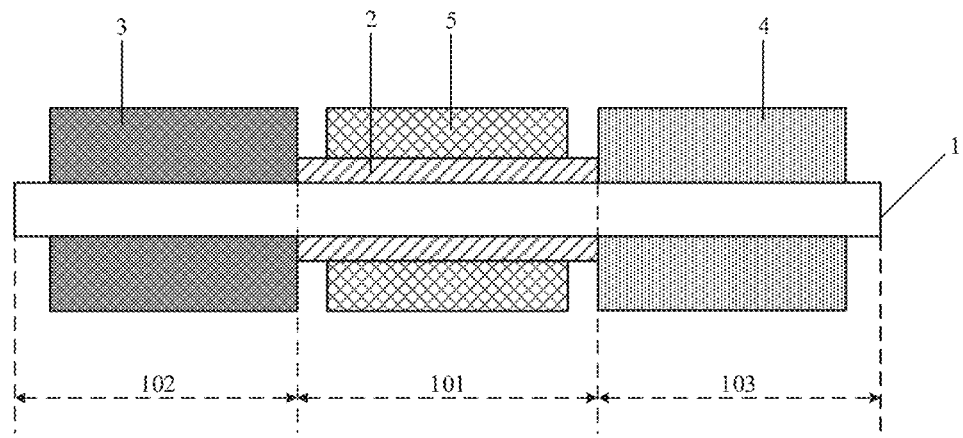
Figure 8C:
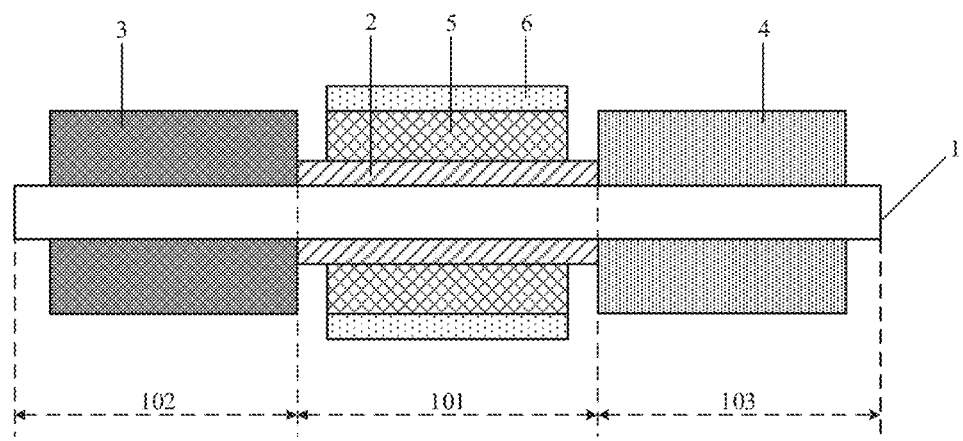

FIGS. 8A-8C are schematic diagrams of a manufacture method of further another nanowire transistor provided by an embodiment of the present disclosure. The difference between this method and the method illustrated in FIGS. 6A-6H is that after forming the source/drain material layer 31 as illustrated in FIG. 6E, the source/drain material layer 31 is patterned to form the source electrode 3 and the drain electrode 4 at the same time, in which a gap is between the source electrode 3 and the semiconductor layer 2, and a gap is between the drain electrode 4 and the semiconductor layer 2. Subsequently, as illustrated in FIG. 8B and FIG. 8C, the gate oxide layer 5 and the gate electrode 6 are sequentially formed respectively by the same method as that of FIG. 6G and FIG. 6H so as to obtain the nanowire transistor illustrated in FIG. 8C.

Figure 9A:
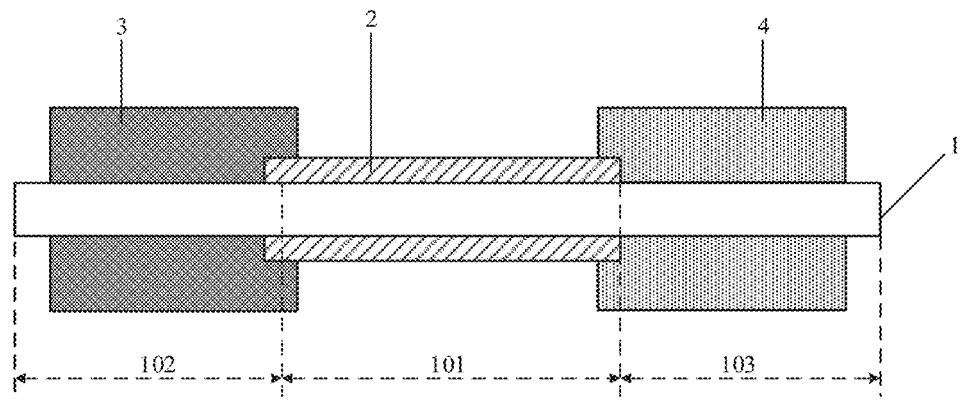
FIGS. 9A-9C are schematic diagrams of a manufacture method of further another nanowire transistor provided by an embodiment of the present disclosure.
Figure 9B:
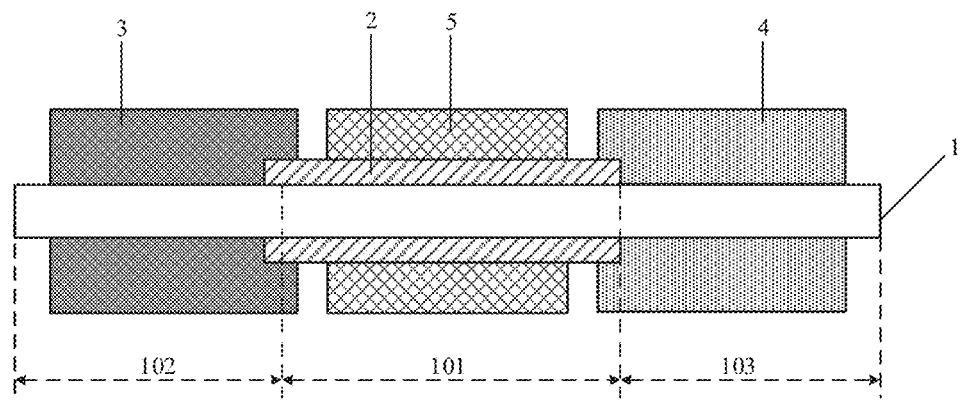
Figure 9C:
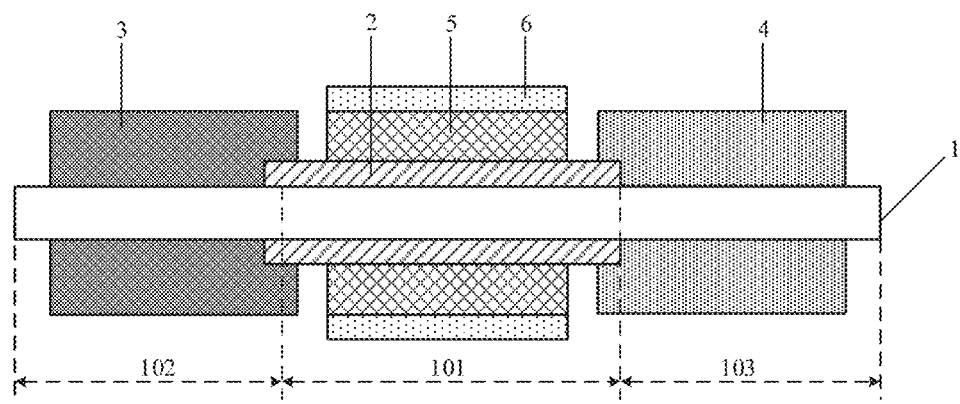

FIGS. 9A-9C are schematic diagrams of a manufacture method of further another nanowire transistor provided by an embodiment of the present disclosure. The difference between this method and the method illustrated in FIGS. 6A-6H is that after the source/drain material layer 31 is formed as illustrated in FIG. 6E, the source/drain material layer 31 is patterned to form the source electrode 3 and the drain electrode 4 at the same time (that is, the source electrode 3 and the drain electrode 4 are formed in the same patterning process), in the direction perpendicular to the axial direction of the semiconductor wire 1, both one portion of the source electrode 3 and one portion of the drain electrode 4 do not overlap with the semiconductor layer 2, and the other portion of the source electrode 3 and the other portion of the drain electrode 4 overlap with the semiconductor layer 2.

For example, in another embodiment of the present disclosure, forming the semiconductor layer includes: forming a semiconductor material layer covering the semiconductor wire; and forming a first via hole penetrating the semiconductor material layer in a portion of the semiconductor material layer in the source region and forming a second via hole penetrating the semiconductor material layer in a portion of the semiconductor material layer in the drain region by a patterning process.

Figure 10A:
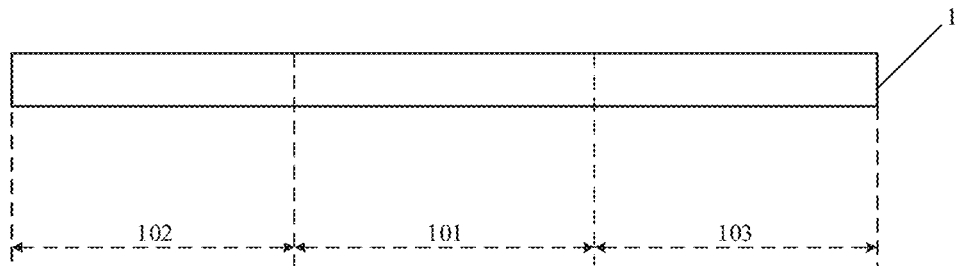
FIGS. 10A-10F are schematic diagrams of a manufacture method of further another nanowire transistor provided by an embodiment of the present disclosure.

Exemplarily, FIGS. 10A-10F are schematic diagrams of further another manufacture method of a nanowire transistor provided by an embodiment of the present disclosure. As illustrated in FIG. 10A, a semiconductor wire 1 is provided. The semiconductor wire 1 includes a first semiconductor material and includes a channel region 101, a source region 102, and a drain region 103. Along the axial direction of the semiconductor wire 1, the channel region 101 is between the source region 102 and the drain region 103. For example, the first semiconductor material is germanium or silicon germanium.

Figure 10B:
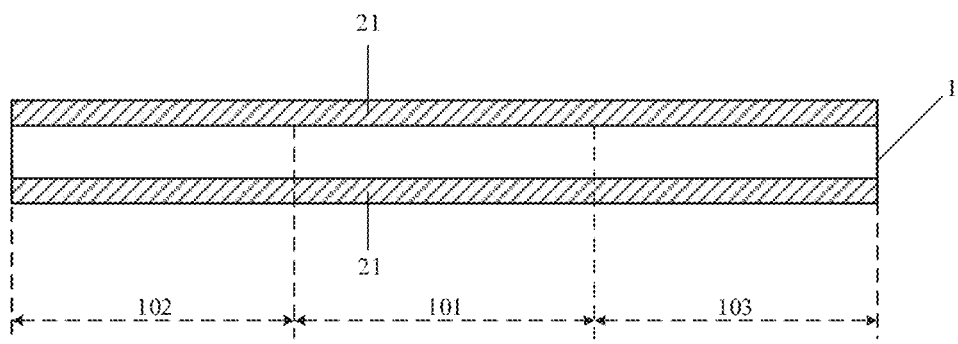

As illustrated in FIG. 10B, a semiconductor material layer 21 covering the semiconductor wire 1 is formed for subsequent formation of a semiconductor layer. For example, the semiconductor material layer 21 includes a second semiconductor material, for example, the second semiconductor material is silicon. For example, the semiconductor material layer is formed by a deposition method. For example, the thickness of the semiconductor material layer 21 is in a range of 2 nm-3 nm.

Figure 10C:
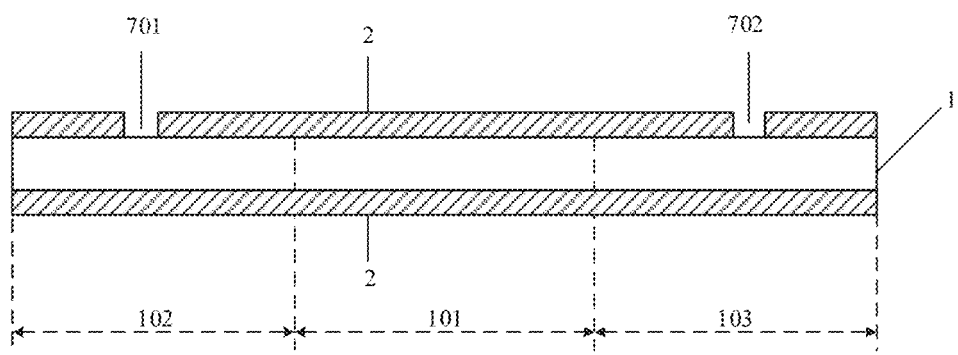

As illustrated in FIG. 10C, a first via hole 701 penetrating the semiconductor layer is formed in a portion of the semiconductor material layer 21 in the source region 102 and a second via hole 702 penetrating semiconductor material layer 21 is formed in a portion of the semiconductor material layer 21 in the drain region 103 by a patterning process, so as to form the semiconductor layer 2 as illustrated in FIG. 10C. The portion of the semiconductor layer 2 in the source region 102 includes the first via hole 701 that penetrates the semiconductor layer 2, and the portion of the semiconductor layer 2 in the drain region 103 includes the second via hole 702 that penetrates the semiconductor layer 2.

Figure 10D:
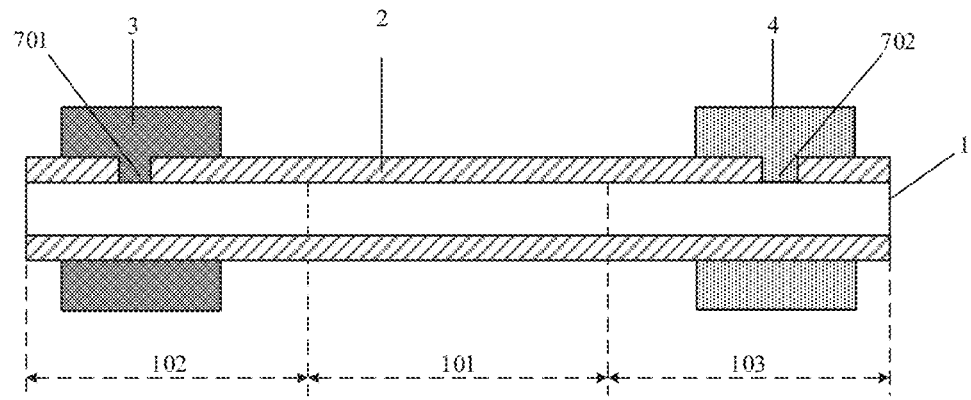

As illustrated in FIG. 10D, after the first via hole 701 and the second via hole 702 are formed, a source electrode 3 is formed in the source region 102 of the semiconductor wire 1 and a drain electrode is formed in the drain region 103 of the semiconductor wire 1. The source electrode 3 directly contacts the source region 102 of the semiconductor wire 1 through the first via hole 701, and the drain electrode 4 directly contacts the drain region 103 of the semiconductor wire 1 through the second via hole 702. For the specific method of forming the source electrode 3 and the drain electrode 4, please refer to the previous descriptions.

Figure 10E:
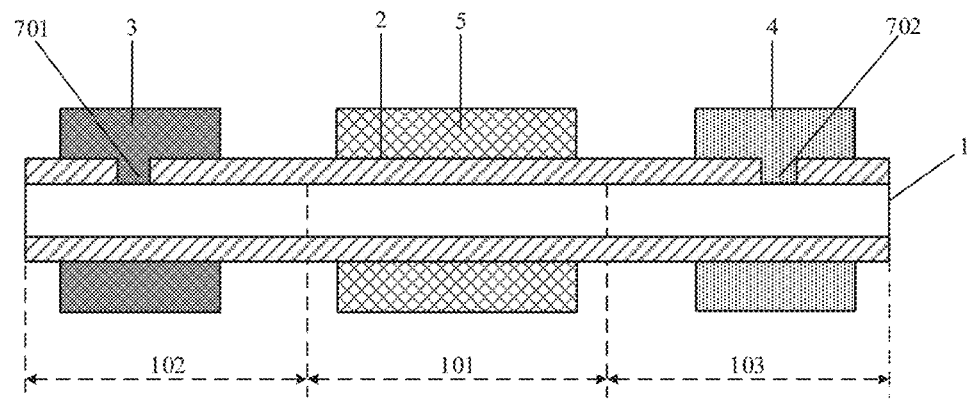
Figure 10F:
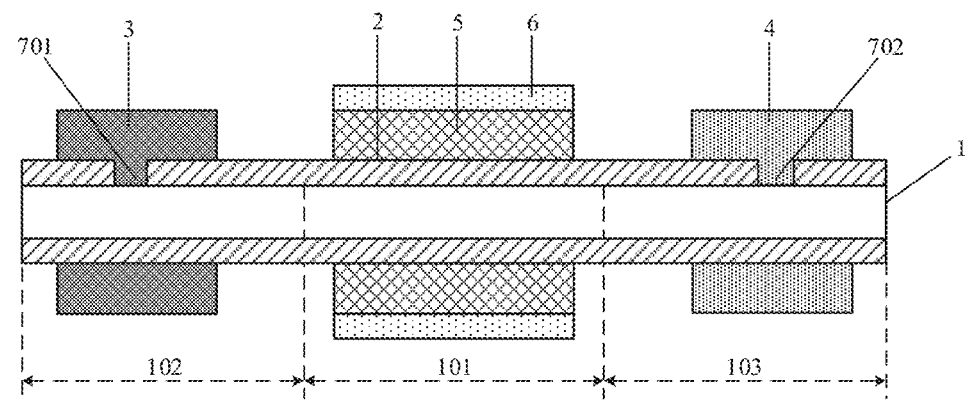

Subsequently, as illustrated in FIG. 10E and FIG. 10F, the gate oxide layer 5 and the gate electrode 6 are sequentially formed respectively by the same method as that illustrated in FIG. 6G and FIG. 6H, so as to obtain the nanowire transistor as illustrated in FIG. 10F.

For another example, forming the semiconductor layer includes: forming a semiconductor material layer covering the semiconductor wire; and forming a first groove penetrating the semiconductor material layer and surrounding the semiconductor wire in a portion of the semiconductor material layer in the source region and forming a second groove penetrating the semiconductor material layer and surrounding the semiconductor wire in a portion of the semiconductor material layer in the drain region by a patterning process.

Figure 11A:
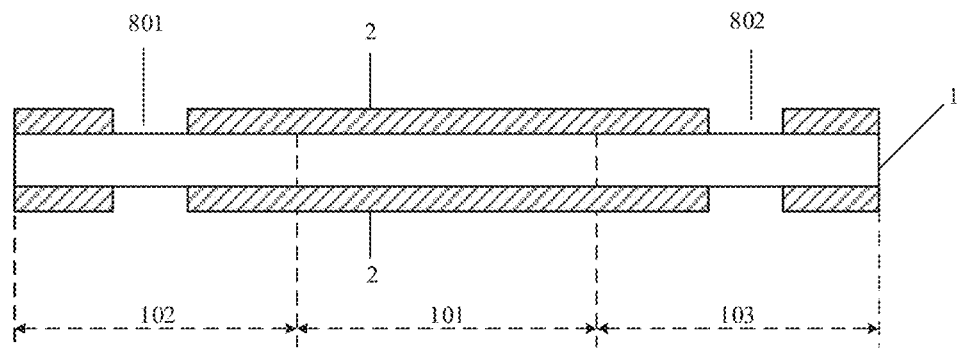
FIGS. 11A-11D are schematic diagrams of a manufacture method of further another nanowire transistor provided by an embodiment of the present disclosure.

Exemplarily, FIGS. 11A-11D are schematic diagrams of a manufacture method of further another nanowire transistor provided by an embodiment of the present disclosure. As illustrated in FIG. 11A, after the structure illustrated in FIG. 10B is formed, a first groove 801 penetrating the semiconductor material layer 21 and surrounding the semiconductor wire 1 is formed in the portion of the semiconductor material layer 21 in the source region 102, and a second groove 802 penetrating the semiconductor material layer 21 and surrounding the semiconductor wire 1 is formed in the portion of the semiconductor material layer 21 in the drain region 103 by a patterning process, so as to form the semiconductor layer 2 as illustrated in FIG. 11A. The semiconductor layer 2 covers the source region 102 and the drain region 103 of the semiconductor wire 1, and the portion of the semiconductor layer 2 in the source region 102 includes the first groove 801 penetrating the semiconductor layer 2 and surrounding the semiconductor wire 1, the portion of the semiconductor layer 2 in the drain region 103 includes the second groove 802 penetrating the semiconductor layer 2 and surrounding the semiconductor wire 1.

Figure 11B:
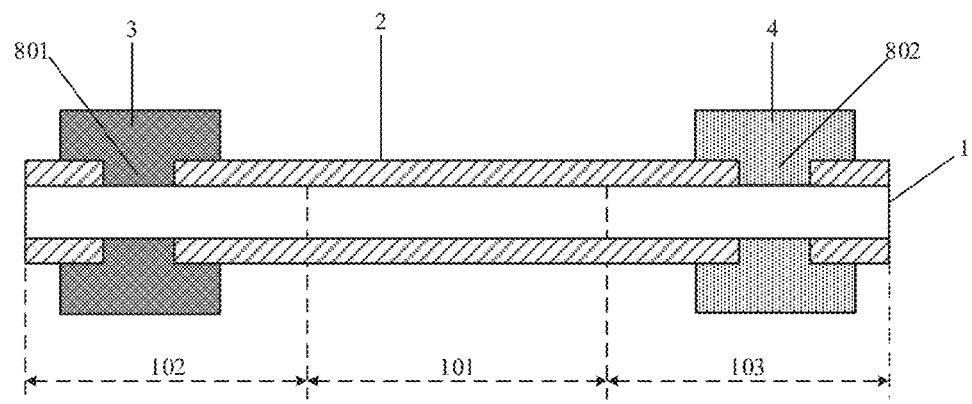

As illustrated in FIG. 11B, after the first groove 801 and the second groove 802 are formed, a source electrode 3 is formed in the source region 102 of the semiconductor wire 1 and a drain electrode is formed in the drain region 103 of the semiconductor wire 1. The source electrode 3 directly contacts the source region 102 of the semiconductor wire 1 through the first groove 801, and the drain electrode 4 directly contacts the drain region 103 of the semiconductor wire 1 through the second groove 802. For the specific method of forming the source electrode 3 and the drain electrode 4, please refer to the previous descriptions.

Figure 11C:
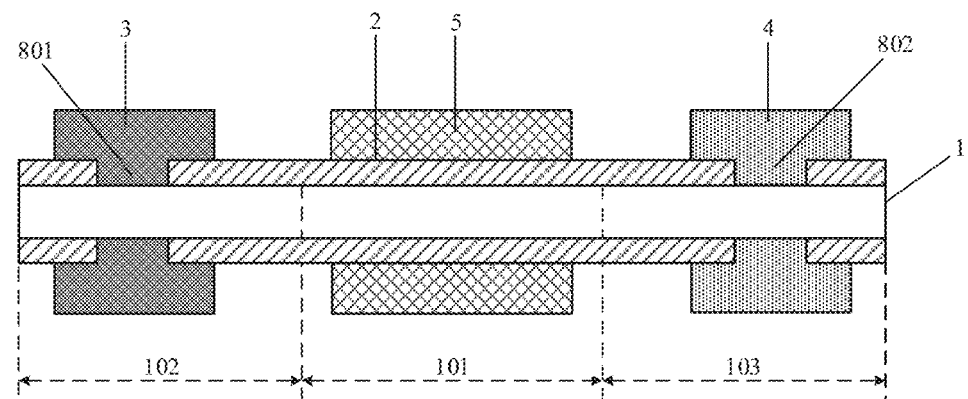
Figure 11D:
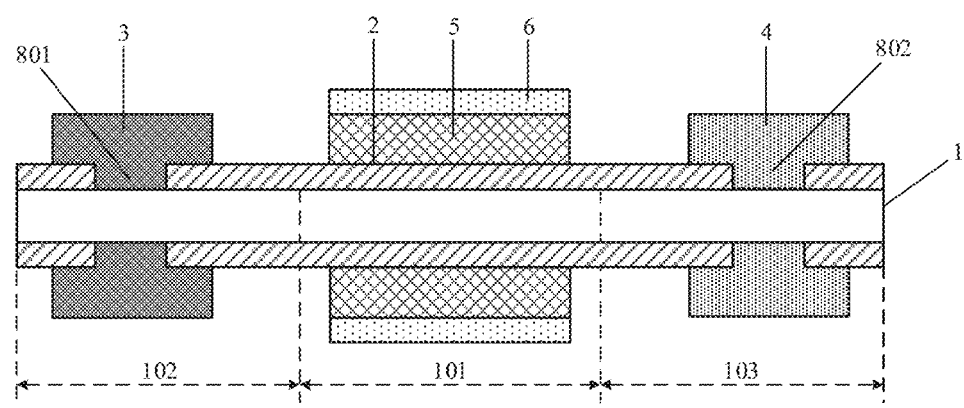

As illustrated in FIG. 11C and FIG. 11D, the gate oxide layer 5 and the gate electrode 6 are sequentially formed respectively by the same method as that illustrated in FIG. 6G and FIG. 6H, so as to obtain the nanowire transistor illustrated in FIG. 11D.

What have been described above are only specific implementations of the present disclosure, the protection scope of the present disclosure is not limited thereto. Therefore, the protection scope of the present disclosure should be based on the protection scope of the claims.

What is claimed is:

1. A nanowire transistor, comprising:
   a semiconductor wire comprising a first semiconductor material and comprising a source region, a drain region, and a channel region, wherein along an axial direction of the semiconductor wire, the channel region is between the source region and the drain region;
   a semiconductor layer which comprises a second semiconductor material, surrounds the semiconductor wire in a direction surrounding the axial direction, and comprises a part covering the channel region of the semiconductor wire; and
   a source electrode and a drain electrode, wherein the source electrode is in the source region of the semiconductor wire and is in direct contact with the source region of the semiconductor wire, and the drain electrode is in the drain region of the semiconductor wire and is in direct contact with the drain region of the semiconductor wire;
   the semiconductor wire comprises a first part protruding from a first end of the part of the semiconductor layer covering the channel region of the semiconductor wire in the axial direction and a second part protruding from a second end of the part of the semiconductor layer covering the channel region of the semiconductor wire in the axial direction, the first part of the semiconductor wire is in the source region, and the second part of the semiconductor wire is in the drain region;
   in a direction perpendicular to the axial direction, one part of the source electrode overlaps with the part of the semiconductor layer covering the channel region of the semiconductor wire, other part of the source electrode does not overlap with the part of the semiconductor layer covering the channel region of the semiconductor wire, and the other part of the source electrode overlaps with and is in direct contact with the first part of the semiconductor wire; one part of the drain electrode overlaps with the part of the semiconductor layer covering the channel region of the semiconductor wire, other part of the drain electrode does not overlap with the part of the semiconductor layer covering the channel region of the semiconductor wire, and the other part of the drain electrode overlaps with and is in direct contact with the second part of the semiconductor wire; and
   a lattice constant of the first semiconductor material is greater than a lattice constant of the second semiconductor material.

2. The nanowire transistor according to claim 1, wherein the source electrode covers at least a part of the source region of the semiconductor wire; and
   the drain electrode covers at least a part of the drain region of the semiconductor wire.

3. The nanowire transistor according to claim 1, wherein the semiconductor layer covers a part of the source region of the semiconductor wire and a part of the drain region of the semiconductor wire;

a portion of the semiconductor layer in the source region comprises a first groove penetrating the semiconductor layer and is formed around semiconductor wire, and a portion of the semiconductor layer in the drain region comprises a second groove penetrating the semiconductor layer and is formed around semiconductor wire; the first groove exposes the first part of the semiconductor wire, and the second groove exposes the second part of the semiconductor wire;

the other part of the source electrode directly contacts the first part of the semiconductor wire through the first groove; and the other part of the drain electrode directly contacts the second part of the semiconductor wire through the second groove.

4. The nanowire transistor according to claim 1, wherein a length of the channel region is equal to a length of the part of the semiconductor layer covering the channel region of the semiconductor wire along the axial direction of the semiconductor wire.

5. The nanowire transistor according to claim 1, further comprising:

a gate oxide layer covering the semiconductor layer; and a gate electrode covering the gate oxide layer, wherein along the axial direction of the semiconductor wire, two ends of the semiconductor layer protrude from the gate oxide layer and the gate electrode.

6. The nanowire transistor according to claim 5, wherein in the direction perpendicular to the axial direction of the semiconductor wire, the source electrode does not overlap with the gate oxide layer, and the drain electrode does not overlap with the gate oxide layer; and in the direction perpendicular to the axial direction of the semiconductor wire, the source electrode does not overlap with the gate electrode, and the drain electrode does not overlap with the gate electrode.

7. The nanowire transistor according to claim 1, wherein the first semiconductor material comprises germanium or germanium silicon, and the second semiconductor material comprises silicon.

8. A nanowire transistor, comprising:

a semiconductor wire comprising a first semiconductor material and comprising a source region, a drain region, and a channel region, wherein along an axial direction of the semiconductor wire, the channel region is between the source region and the drain region;

a semiconductor layer which comprises a second semiconductor material, surrounds the semiconductor wire in a direction surrounding the axial direction, and comprises a part covering the channel region of the semiconductor wire; and a source electrode and a drain electrode, wherein the source electrode is in the source region of the semiconductor wire and is in direct contact with the source region of the semiconductor wire, and the drain electrode is in the drain region of the semiconductor wire and is in direct contact with the drain region of the semiconductor wire;

the semiconductor wire comprises a first part protruding from a first end of the part of the semiconductor layer covering the channel region of the semiconductor wire in the axial direction and a second part protruding from a second end of the part of the semiconductor layer covering the channel region of the semiconductor wire in the axial direction, the first part of the semiconductor wire is in the source region, and the second part of the semiconductor wire is in the drain region;

in a direction perpendicular to the axial direction, one part of the source electrode overlaps with the part of the semiconductor layer covering the channel region of the semiconductor wire, other part of the source electrode does not overlap with the part of the semiconductor layer covering the channel region of the semiconductor wire, and the other part of the source electrode overlaps with and is in direct contact with the first part of the semiconductor wire; one part of the drain electrode overlaps with the part of the semiconductor layer covering the channel region of the semiconductor wire, other part of the drain electrode does not overlap with the part of the semiconductor layer covering the channel region of the semiconductor wire, and the other part of the drain electrode overlaps with and is in direct contact with the second part of the semiconductor wire; and wherein the semiconductor wire is in a cylindrical shape, and the semiconductor layer is in an annular shape.

9. A manufacture method of a nanowire transistor, comprising:

providing a semiconductor wire, wherein the semiconductor wire comprises a first semiconductor material and comprises a source region, a drain region, and a channel region, along an axial direction of the semiconductor wire, the channel region is between the source region and the drain region;

forming a semiconductor layer, wherein the semiconductor layer comprises a second semiconductor material, surrounds the semiconductor wire in a direction surrounding the axial direction, and comprises a part covering the channel region of the semiconductor wire; and forming a source electrode and a drain electrode, wherein the source electrode is in the source region of the semiconductor wire and is in direct contact with the source region of the semiconductor wire, and the drain electrode is in the drain region of the semiconductor wire and is in direct contact with the drain region of the semiconductor wire, wherein the semiconductor wire comprises a first part protruding from a first end of the part of the semiconductor layer covering the channel region of the semiconductor wire in the axial direction and a second part protruding from a second end of the part of the semiconductor layer covering the channel region of the semiconductor wire in the axial direction, the first part of the semiconductor wire is in the source region, and the second part of the semiconductor wire is in the drain region;

in a direction perpendicular to the axial direction, one part of the source electrode overlaps with the part of the semiconductor layer covering the channel region of the semiconductor wire, other part of the source electrode does not overlap with the part of the semiconductor layer covering the channel region of the semiconductor wire, and the other part of the source electrode overlaps with and is in direct contact with the first part of the semiconductor wire; one part of the drain electrode overlaps with the part of the semiconductor layer covering the channel region of the semiconductor wire, and other part of the drain electrode does not overlap with the part of the semiconductor layer covering the channel region of the semiconductor wire, and the other part of the drain electrode overlaps with and is in direct contact with the second part of the semiconductor wire;

a lattice constant of the first semiconductor material is greater than a lattice constant of the second semiconductor material.

10. The manufacture method of the nanowire transistor according to claim 9, wherein the forming the semiconductor layer comprises:
 forming a semiconductor material layer covering the semiconductor wire; and
 removing portions of the semiconductor material layer covering the source region and the drain region by a patterning process to form the semiconductor layer.

11. The manufacture method of the nanowire transistor according to claim 10, wherein the forming the source electrode and the drain electrode comprises:
 forming the source electrode in the source region after removing the portions of the semiconductor material layer; and
 forming the drain electrode in the drain region after removing the portions of the semiconductor material layer.

12. The manufacture method of the nanowire transistor according to claim 11, wherein the source electrode covers the source region of the semiconductor wire; and
 the drain electrode covers the drain region of the semiconductor wire.

13. The manufacture method of the nanowire transistor according to claim 9, wherein the forming the semiconductor layer comprises:
 forming a semiconductor material layer covering the semiconductor wire;
 forming a first groove penetrating the semiconductor material layer and is formed around the semiconductor wire in a portion of the semiconductor material layer in the source region, and
 forming a second groove penetrating the semiconductor material layer and is formed around the semiconductor wire in a portion of the semiconductor material layer in the drain region by a patterning process, wherein
 the first groove exposes the first part of the semiconductor wire, and the second groove exposes the second part of the semiconductor wire.

14. The manufacture method of the nanowire transistor according to claim 13, further comprising:
 after forming the first groove and the second groove, forming the source electrode in the source region of the semiconductor wire and forming the drain electrode in the drain region of the semiconductor wire,
 wherein the other part of the source electrode directly contacts the first part of the semiconductor wire through the first groove, and
 the other part of the drain electrode directly contacts the second part of the semiconductor wire through the second groove.

15. The manufacture method of the nanowire transistor according to claim 9, further comprising:
 forming a gate oxide layer covering the semiconductor layer; and
 forming a gate electrode covering the gate oxide layer,
 wherein along the axial direction of the semiconductor wire, two ends of the semiconductor layer protrude from the gate oxide layer and the gate electrode.

* * * * *